(12) United States Patent  
Okuda

(10) Patent No.: US 9,860,006 B1  
(45) Date of Patent: Jan. 2, 2018

(54) MULTIPLEXER, HIGH-FREQUENCY FRONT-END CIRCUIT, AND COMMUNICATION DEVICE

(71) Applicant: Murata Manufacturing Co., Ltd., Nagaokakyo-shi, Kyoto-fu (JP)

(72) Inventor: Tetsuro Okuda, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/636,676

(22) Filed: Jun. 29, 2017

(30) Foreign Application Priority Data

Jul. 15, 2016 (JP) ................. 2016-140918

(51) Int. Cl.
| | |
|---|---|
| H04M 1/00 | (2006.01) |
| H04J 3/24 | (2006.01) |
| H04B 1/48 | (2006.01) |
| H03H 9/145 | (2006.01) |
| H03H 9/25 | (2006.01) |
| H03H 9/72 | (2006.01) |
| G06F 13/22 | (2006.01) |
| H04J 3/16 | (2006.01) |
| H04B 1/00 | (2006.01) |
| H04B 1/403 | (2015.01) |

(52) U.S. Cl.
CPC .............. *H04J 3/247* (2013.01); *G06F 13/22* (2013.01); *H03H 9/145* (2013.01); *H03H 9/25* (2013.01); *H03H 9/72* (2013.01); *H04B 1/005* (2013.01); *H04B 1/406* (2013.01); *H04B 1/48* (2013.01); *H04J 3/1682* (2013.01)

(58) Field of Classification Search
USPC .................... 455/553.1, 550.1, 91
See application file for complete search history.

(56) References Cited

U.S. PATENT DOCUMENTS

| | | | |
|---|---|---|---|
| 7,078,989 B2* | 7/2006 | Inoue ................. | H03H 9/02685 333/133 |
| 9,287,849 B2* | 3/2016 | Ikeuchi .............. | H03H 9/02803 |
| 2005/0035831 A1* | 2/2005 | Kawachi ............. | H03H 9/6469 333/195 |
| 2007/0030096 A1* | 2/2007 | Nishihara ............ | H03H 9/605 333/133 |

(Continued)

FOREIGN PATENT DOCUMENTS

JP    2004-088143 A    3/2004

*Primary Examiner* — Fayyaz Alam  
(74) *Attorney, Agent, or Firm* — Keating & Bennett, LLP

(57) ABSTRACT

A multiplexer includes filters connected to each other at a common terminal, a low-frequency filter with a first pass band, and a high-frequency filter with a second pass band that is higher than the first pass band. The low-frequency filter includes an initial-stage filter section including at least one first elastic wave resonator located on the common terminal side among at least two elastic wave resonators, and a subsequent-stage filter section that includes a second elastic wave resonator other than the at least one first elastic wave resonator. A reflection coefficient in the second pass band when the initial-stage filter section is viewed from the common terminal side as a single component is larger than a reflection coefficient in the second pass band when the subsequent-stage filter section is viewed from the common terminal side as a single component.

23 Claims, 32 Drawing Sheets

(56) References Cited

U.S. PATENT DOCUMENTS

| | | | |
|---|---|---|---|
| 2014/0159833 A1* | 6/2014 | Ikeuchi | H03H 9/02803 |
| | | | 333/195 |
| 2015/0155850 A1* | 6/2015 | Kuzushita | H03H 9/0566 |
| | | | 333/133 |
| 2016/0261249 A1* | 9/2016 | Takamine | H03H 9/6483 |

* cited by examiner

FIG. 8B

| INITIAL-STAGE FILTER SECTION 12F | SUBSEQUENT-STAGE FILTER SECTION 12R |
|---|---|
| LN RAYLEIGH WAVES UTILIZED | SMR |
|  | FBAR |
| LT LEAKY WAVES UTILIZED | SMR |
|  | FBAR |
| LN LOVE WAVES UTILIZED | SMR |
|  | FBAR |
| ACOUSTIC VELOCITY FILM MULTILAYER STRUCTURE | SMR |
|  | FBAR |

RL IN LOW-FREQUENCY REGION 1 < RL IN LOW-FREQUENCY REGION 1

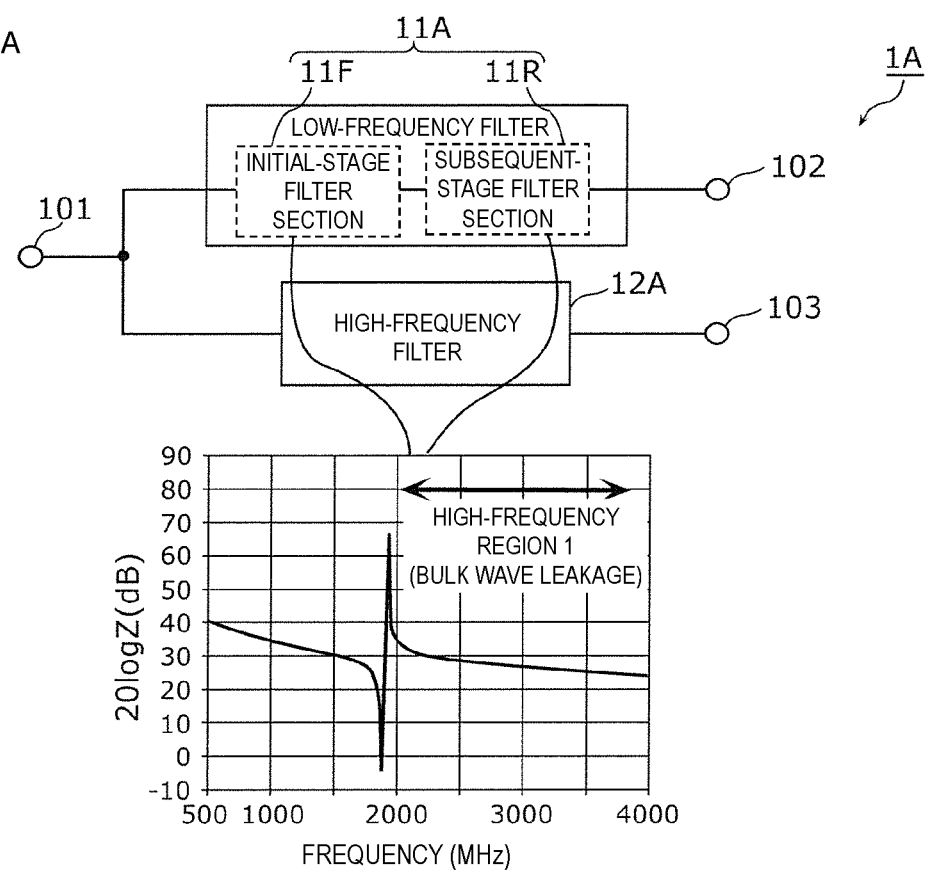

FIG. 9B

| INITIAL-STAGE FILTER SECTION 11F | SUBSEQUENT-STAGE FILTER SECTION 11R |
|---|---|
| LN RAYLEIGH WAVES UTILIZED | ACOUSTIC VELOCITY FILM MULTILAYER STRUCTURE |
| | LT LEAKY WAVES UTILIZED |
| | LN LOVE WAVES UTILIZED |
| ACOUSTIC VELOCITY FILM MULTILAYER STRUCTURE | LT LEAKY WAVES UTILIZED |
| | LN LOVE WAVES UTILIZED |
| LT LEAKY WAVES UTILIZED | LN LOVE WAVES UTILIZED |
| SMR | ACOUSTIC VELOCITY FILM MULTILAYER STRUCTURE |
| | LT LEAKY WAVES UTILIZED |
| | LN LOVE WAVES UTILIZED |
| FBAR | ACOUSTIC VELOCITY FILM MULTILAYER STRUCTURE |
| | LT LEAKY WAVES UTILIZED |
| | LN LOVE WAVES UTILIZED |

RL IN HIGH-FREQUENCY REGION 1 < RL IN HIGH-FREQUENCY REGION 1

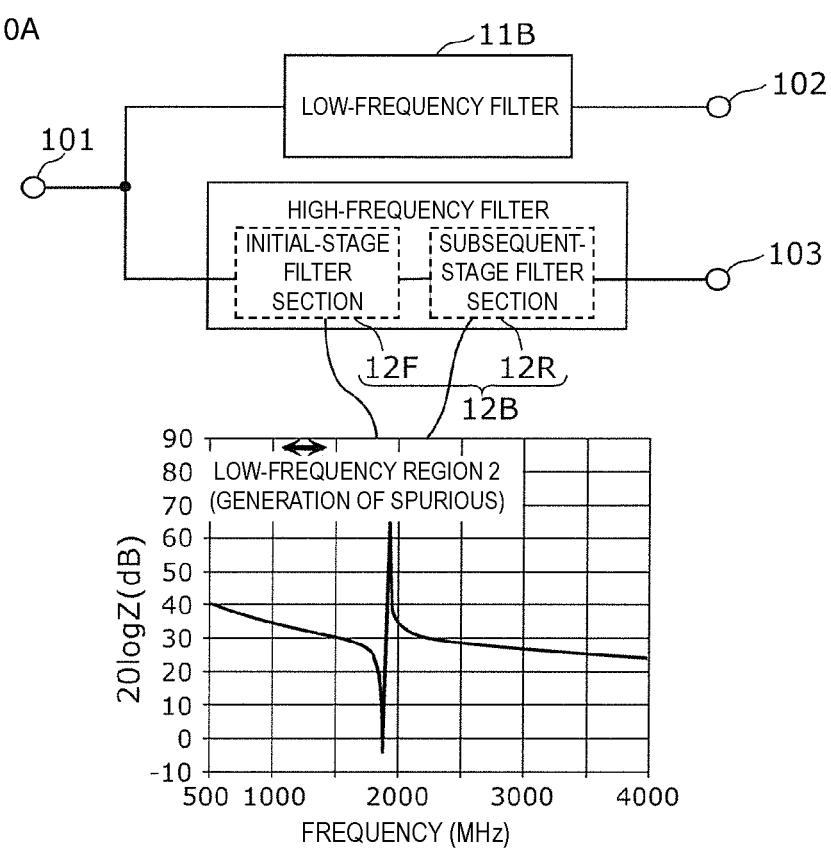

FIG. 10B

| INITIAL-STAGE FILTER SECTION 12F | SUBSEQUENT-STAGE FILTER SECTION 12R |
|---|---|
| LN RAYLEIGH WAVES UTILIZED | ACOUSTIC VELOCITY FILM MULTILAYER STRUCTURE |
| LT LEAKY WAVES UTILIZED | |
| LN LOVE WAVES UTILIZED | |
| SMR | |
| FBAR | |
| LN RAYLEIGH WAVES UTILIZED | LT LEAKY WAVES UTILIZED |
| ACOUSTIC VELOCITY FILM MULTILAYER STRUCTURE | |
| LN LOVE WAVES UTILIZED | |
| SMR | |
| FBAR | |

RL IN LOW-FREQUENCY REGION 2 < RL IN LOW-FREQUENCY REGION 2

FIG. 11B

| INITIAL-STAGE FILTER SECTION 11F | SUBSEQUENT-STAGE FILTER SECTION 11R |
|---|---|
| ACOUSTIC VELOCITY FILM MULTILAYER STRUCTURE | LN RAYLEIGH WAVES UTILIZED |
| LT LEAKY WAVES UTILIZED | |
| LN LOVE WAVES UTILIZED | |
| SMR | |
| FBAR | |
| LN RAYLEIGH WAVES UTILIZED | LN LOVE WAVES UTILIZED |
| ACOUSTIC VELOCITY FILM MULTILAYER STRUCTURE | |
| LT LEAKY WAVES UTILIZED | |
| SMR | |
| FBAR | |

RL IN HIGH-FREQUENCY REGION 2 < RL IN HIGH-FREQUENCY REGION 2

FIG. 12B

| ELASTIC WAVE MODE | STRUCTURAL PARAMETER |
|---|---|
| LT LEAKY WAVES UTILIZED | IDT ELECTRODE FILM THICKNESS |
| | Duty |
| ACOUSTIC VELOCITY FILM MULTILAYER STRUCTURE | IDT ELECTRODE FILM THICKNESS |
| | Duty |
| | FILM THICKNESS OF LOW ACOUSTIC VELOCITY FILM |

RAYLEIGH WAVE SPURIOUS

FIG. 12C

| ELASTIC WAVE MODE | STRUCTURAL PARAMETER |
|---|---|
| LN RAYLEIGH WAVES UTILIZED | IDT ELECTRODE FILM THICKNESS |
| | PROTECTIVE FILM |
| | Duty |
| LN LOVE WAVES UTILIZED | IDT ELECTRODE FILM THICKNESS |
| | PROTECTIVE FILM |
| | Duty |
| ACOUSTIC VELOCITY FILM MULTILAYER STRUCTURE | LT FILM THICKNESS |
| | FILM THICKNESS OF LOW ACOUSTIC VELOCITY FILM |
| | Si CRYSTAL ORIENTATION |

HIGH-ORDER MODE

FIG. 13

| ELASTIC WAVE MODE | STRUCTURAL PARAMETER |
|---|---|
| LT LEAKY WAVES UTILIZED | IDT ELECTRODE FILM THICKNESS |
| LN LOVE WAVES UTILIZED | IDT ELECTRODE FILM THICKNESS |

BULK WAVES

MULTIPLEXER, HIGH-FREQUENCY FRONT-END CIRCUIT, AND COMMUNICATION DEVICE

CROSS REFERENCE TO RELATED APPLICATIONS

This application claims the benefit of priority to Japanese Patent Application No. 2016-140918 filed on Jul. 15, 2016. The entire contents of this application are hereby incorporated herein by reference.

BACKGROUND OF THE INVENTION

1. Field of the Invention

The present invention relates to a multiplexer that includes an elastic wave filter, to a high-frequency front-end circuit, and to a communication device.

2. Description of the Related Art

In recent years, there has been a demand for cellular phones to be able to handle a plurality of frequency bands and a plurality of wireless systems, so called multiband and multimode, as a single terminal. In order to realize this, a multiplexer that separates high-frequency signals having a plurality of wireless carrier frequencies is arranged immediately next to a single antenna. Such a multiplexer has a configuration in which a plurality of band pass filters are connected in parallel with an antenna common terminal.

Japanese Unexamined Patent Application Publication No. 2004-88143 discloses a surface acoustic wave splitter having a configuration in which an antenna element and a plurality of surface acoustic wave filters are connected to each other without a switch, and the size of the surface acoustic wave splitter is able to be reduced.

However, when a plurality of filters are connected to each other at a single antenna terminal as in the surface acoustic wave splitter disclosed in the above-cited patent document, the filter characteristics of one filter are greatly affected by the filter characteristics of the other filter(s). For example, in the case where return loss of the other filter(s) seen from the antenna terminal side increases in the pass band of the one filter, the insertion loss of the one filter in the pass band of the one filter is increased by the reflection characteristics of the other filter(s).

SUMMARY OF THE INVENTION

Preferred embodiments of the present invention provide small-sized multiplexers, high-frequency front-end circuits, and communication devices in which propagation loss of a high-frequency signal is significantly reduced or prevented.

A multiplexer according to a preferred embodiment of the present invention includes a common terminal, a first input/output terminal, a second input/output terminal, and a plurality of filters that are connected to each other at the common terminal. The multiplexer includes a first filter that includes at least two elastic wave resonators between the common terminal and the first input/output terminal, the first filter including a first pass band; and a second filter that is connected between the common terminal and the second input/output terminal, the second filter including a second pass band that is at a different frequency from the first pass band. The first filter includes an initial-stage filter section that includes at least one first elastic wave resonator located on the common terminal side among the at least two elastic wave resonators, and a subsequent-stage filter section that includes a second elastic wave resonator other than the at least one first elastic wave resonator among the at least two elastic wave resonators. A reflection coefficient of the initial-stage filter section in the second pass band when the initial-stage filter section is viewed from the common terminal side as a single component is larger than a reflection coefficient of the subsequent-stage filter section in the second pass band when the subsequent-stage filter section is viewed from the common terminal side as a single component.

In the case of a configuration in which the first filter and the second filter are connected to each other at the common terminal, the insertion loss of the second filter in the second pass band is affected by the reflection characteristic of the first filter seen from the common terminal side in addition to the insertion loss of the second filter itself. More specifically, the insertion loss of the second filter in the second pass band decreases as the reflection coefficient of the first filter in the second pass band seen from the common terminal side increases (referred to as connection loss).

According to the above configuration, the reflection coefficient of the initial-stage filter section of the first filter in the second pass band is larger than the reflection coefficient of the subsequent-stage filter section of the first filter in the second pass band, and therefore, the return loss in the second pass band when the first filter is viewed from the common terminal side is able to be further significantly reduced or prevented. Thus, the connection loss of the second filter is able to be significantly reduced or prevented, and therefore the insertion loss of the entire multiplexer is able to be significantly reduced or prevented.

Furthermore, the at least one first elastic wave resonator that defines the initial-stage filter section may include one elastic wave resonator that is closest to the common terminal among the at least two elastic wave resonators, for example.

In a filter including of a plurality of elastic wave resonators, the return loss of the one elastic wave resonator that is closest to the common terminal is dominant in the return loss seen from the common terminal side, and the connection loss of the second filter is able to be significantly reduced or prevented.

Furthermore, the first filter may include a ladder filter structure, and the initial-stage filter section may include at least either of a series arm resonator and a parallel arm resonator as the at least one first elastic wave resonator, for example.

Thus, connection loss of the second filter is able to be significantly reduced or prevented while providing a low loss characteristic for the first filter.

In addition, the first filter may include a longitudinally coupled type filter structure, for example.

Thus, the first filter is able to be adapted to a filter characteristic which strengthens attenuation, for example.

In addition, the first pass band may be located closer to a high-frequency side than the second pass band, the at least one first elastic wave resonator that defines the initial-stage filter section may be a surface acoustic wave resonator that includes a substrate including a piezoelectric layer, and an IDT electrode that is provided on the substrate, and in the initial-stage filter section, any one of (1) Rayleigh waves that propagate along the piezoelectric layer, which includes $LiNbO_3$, (2) leaky waves that propagate along the piezoelectric layer, which includes $LiTaO_3$, and (3) Love waves that propagate along the piezoelectric layer, which includes $LiNbO_3$, may be utilized as surface acoustic waves, for example.

The return loss in a region including frequencies lower than the resonance point and the anti-resonance point of the elastic wave resonator is smaller in the case where any of Rayleigh waves that propagate along a piezoelectric layer including $LiNbO_3$, leaky waves that propagate along a piezoelectric layer including $LiTaO_3$, and Love waves that propagate along a piezoelectric layer including $LiNbO_3$ are utilized as surface acoustic waves than in the case where another type of elastic wave is utilized.

Therefore, in the case where the first filter is a high-frequency filter and the second filter is a low-frequency filter, the reflection coefficient of the initial-stage filter section of the first filter in the second pass band is able to be made larger than the reflection coefficient of the subsequent-stage filter section of the first filter in the second pass band. Thus, the connection loss of the second filter is able to be significantly reduced or prevented.

In addition, in the subsequent-stage filter section, the second elastic wave resonator may include a solidly mounted resonator or a film bulk acoustic resonator, for example.

With the above configuration, a low loss characteristic and a steep pass band characteristic are able to be provided for the first filter by including the configuration of the subsequent-stage filter section while the return loss of the first filter is able to be significantly reduced or prevented by including the configuration of the initial-stage filter section.

Furthermore, the first pass band may be located closer to a high-frequency side than the second pass band, the at least one first elastic wave resonator that defines the initial-stage filter section may be a surface acoustic wave resonator that includes a substrate including a piezoelectric layer, and an IDT electrode that is provided on the substrate, in the initial-stage filter section, the at least one first elastic wave resonator may include an acoustic velocity film multilayer structure that includes the piezoelectric layer that includes the IDT electrode provided on one main surface thereof, a high-acoustic-velocity support substrate in which an acoustic velocity of propagating bulk waves is higher than an acoustic velocity of elastic waves propagating along the piezoelectric layer, and a low-acoustic-velocity film that is located between the high-acoustic-velocity support substrate and the piezoelectric layer and in which an acoustic velocity of propagating bulk waves is lower than an acoustic velocity of elastic waves propagating along the piezoelectric layer, and in the subsequent-stage filter section, the second elastic wave resonator may include a solidly mounted resonator or a film bulk acoustic resonator, for example.

The reflection coefficient in a region including frequencies lower than the resonance point and the anti-resonance point of the elastic wave resonator is larger in the case where the elastic wave resonator has an acoustic velocity film multilayer structure than in the case where the elastic wave resonator includes a solidly mounted resonator or a film bulk acoustic resonator.

Therefore, in the case where the first filter is a high-frequency filter and the second filter is a low-frequency filter, the reflection coefficient of the initial-stage filter section of the first filter in the second pass band is able to be made larger than the reflection coefficient of the subsequent-stage filter section of the first filter in the second pass band. Thus, the connection loss of the second filter is able to be significantly reduced or prevented. In addition, a low loss characteristic and a steep pass band characteristic is able to be provided for the first filter by including the configuration of the subsequent-stage filter section while the return loss of the first filter is able to be significantly reduced or prevented by including the configuration of the initial-stage filter section.

Furthermore, the first pass band may be located closer to a low-frequency side than the second pass band, and in the initial-stage filter section, (1) Rayleigh waves that propagate along a piezoelectric layer including $LiNbO_3$ may be utilized as surface acoustic waves, (2) the at least one first elastic wave resonator may include a solidly mounted resonator, or (3) the at least one first elastic wave resonator may include a film bulk acoustic resonator, for example.

Unwanted waves are generated by leakage of bulk waves in a region including frequencies higher than the resonance point and the anti-resonance point of the elastic wave resonator, and the strength of the unwanted waves is able to be significantly reduced in the case where Rayleigh waves that propagate along a piezoelectric layer including $LiNbO_3$ are utilized as surface acoustic waves, the elastic wave resonator includes a solidly mounted resonator, or the elastic wave resonator includes a film bulk acoustic resonator.

Therefore, in the case where the first filter is a low-frequency filter and the second filter is a high-frequency filter, the reflection coefficient of the initial-stage filter section of the first filter in the second pass band is able to be made larger than the reflection coefficient of the subsequent-stage filter section of the first filter in the second pass band. Thus, the connection loss of the second filter is able to be significantly reduced or prevented.

Furthermore, in the subsequent-stage filter section, (1) the second elastic wave resonator may include an acoustic velocity film multilayer structure that includes a piezoelectric layer that includes an IDT electrode provided on one main surface thereof, a high-acoustic-velocity support substrate in which an acoustic velocity of propagating bulk waves is higher than an acoustic velocity of elastic waves propagating along the piezoelectric layer, and a low-acoustic-velocity film that is located between the high-acoustic-velocity support substrate and the piezoelectric layer and in which an acoustic velocity of propagating bulk waves is lower than an acoustic velocity of elastic waves propagating along the piezoelectric layer, (2) leaky waves that propagate along a piezoelectric layer including $LiTaO_3$ may be utilized as surface acoustic waves, or (3) Love waves that propagate along a piezoelectric layer including $LiNbO_3$ may be utilized as surface acoustic waves, for example.

With the above configuration, a low loss characteristic and excellent temperature characteristics are able to be provided for the first filter in the case where the acoustic velocity film multilayer structure is provided for the subsequent-stage filter section or a wide band width is able to be provided for the first filter in the case where Love waves generated by $LiNbO_3$ are utilized as surface acoustic waves in the subsequent-stage filter section while the reflection coefficient of the first filter is able to be increased by including the configuration of the initial-stage filter section.

In addition, the first pass band may be located closer to a low-frequency side than the second pass band, the at least one first elastic wave resonator and the second elastic wave resonator that respectively define the initial-stage filter section and the subsequent-stage filter section may be surface acoustic wave resonators that each include a substrate including a piezoelectric layer, and an IDT electrode that is provided on the substrate, in the initial-stage filter section, the at least one first elastic wave resonator may include an acoustic velocity film multilayer structure that includes the piezoelectric layer that includes the IDT electrode provided on one main surface thereof, a high-acoustic-velocity support substrate in which an acoustic velocity of propagating bulk waves is higher than an acoustic velocity of elastic waves propagating along the piezoelectric layer, and a low-acoustic-velocity film that is located between the high-acoustic-velocity support substrate and the piezoelectric layer and in which an acoustic velocity of propagating bulk waves is lower than an acoustic velocity of elastic waves propagating along the piezoelectric layer, and in the subsequent-stage filter section, (1) leaky waves that propagate along the piezoelectric layer, which includes $LiTaO_3$, or (2) Love waves that propagate along the piezoelectric layer, which includes $LiNbO_3$, may be utilized as surface acoustic waves, for example.

Unwanted waves are generated by leakage of bulk waves in a region including frequencies higher than the resonance point and the anti-resonance point of the elastic wave resonator, and the strength of the unwanted waves is able to be made smaller in the case where the acoustic velocity film multilayer structure is provided compared with the case where leaky waves from $LiTaO_3$ are utilized as surface acoustic waves or Love waves from $LiNbO_3$ are utilized as surface acoustic waves.

Therefore, in the case where the first filter is a low-frequency filter and the second filter is a high-frequency filter, the reflection coefficient of the initial-stage filter section of the first filter in the second pass band is able to be made larger than the reflection coefficient of the subsequent-stage filter section of the first filter in the second pass band. Thus, the connection loss of the second filter is able to be significantly reduced or prevented. Furthermore, a wide band width is able to be provided for the first filter in the case where Love waves generated by $LiNbO_3$ are utilized as surface acoustic waves in the subsequent-stage filter section.

In addition, the first pass band may be located closer to a low-frequency side than the second pass band, the at least one first elastic wave resonator and the second elastic wave resonator that respectively define the initial-stage filter section and the subsequent-stage filter section may be surface acoustic wave resonators that each include a substrate including a piezoelectric layer, and an IDT electrode that is provided on the substrate, in the initial-stage filter section, leaky waves that propagate along the piezoelectric layer, which includes $LiTaO_3$, may be utilized as surface acoustic waves, and in the subsequent-stage filter section, Love waves that propagate along the piezoelectric layer, which includes $LiNbO_3$, may be utilized as surface acoustic waves, for example.

Unwanted waves are generated by leakage of bulk waves in a region including frequencies higher than the resonance point and the anti-resonance point of the elastic wave resonator, and the strength of the unwanted waves is able to be made smaller in the case where leaky waves from $LiTaO_3$ are utilized as surface acoustic waves compared with the case where Love waves from $LiNbO_3$ are utilized as surface acoustic waves.

Therefore, in the case where the first filter is a low-frequency filter and the second filter is a high-frequency filter, the reflection coefficient of the initial-stage filter section of the first filter in the second pass band is able to be made larger than the reflection coefficient of the subsequent-stage filter section of the first filter in the second pass band. Thus, the connection loss of the second filter is able to be significantly reduced or prevented. Furthermore, a wide band width is able to be provided for the first filter in the case where Love waves generated by $LiNbO_3$ are utilized as surface acoustic waves in the subsequent-stage filter section.

Furthermore, the first pass band may be located closer to a high-frequency side than the second pass band, in the initial-stage filter section, (1) Rayleigh waves that propagate along a piezoelectric layer including $LiNbO_3$ may be utilized as surface acoustic waves, (2) leaky waves that propagate along a piezoelectric layer including $LiTaO_3$ may be utilized as surface acoustic waves, (3) Love waves that propagate along a piezoelectric layer including $LiNbO_3$ may be utilized as surface acoustic waves, (4) the at least one first elastic wave resonator may include a solidly mounted resonator, or (5) the at least one first elastic wave resonator may include a film bulk acoustic resonator, and in the subsequent-stage filter section, the second elastic wave resonator may include an acoustic velocity film multilayer structure that includes a piezoelectric layer that includes an IDT electrode provided on one main surface thereof, a high-acoustic-velocity support substrate in which an acoustic velocity of propagating bulk waves is higher than an acoustic velocity of elastic waves propagating along the piezoelectric layer, and a low-acoustic-velocity film that is located between the high-acoustic-velocity support substrate and the piezoelectric layer and in which an acoustic velocity of propagating bulk waves is lower than an acoustic velocity of elastic waves propagating along the piezoelectric layer, for example.

A Rayleigh wave spurious signal is generated at a frequency about 0.76 times the resonant frequency of the elastic wave resonator when an elastic wave resonator has the acoustic velocity film multilayer structure, for example. Therefore, the reflection coefficient of the first filter in the second pass band is able to be made large by including the acoustic velocity film multilayer structure in the subsequent-stage filter section of the first filter and not including the acoustic velocity film multilayer structure in the initial-stage filter section of the first filter.

Therefore, in the case where the first filter is a high-frequency filter and the second filter is a low-frequency filter, the connection loss of the second filter is able to be significantly reduced or prevented.

In addition, the first pass band may be located closer to a high-frequency side than the second pass band, in the initial-stage filter section, (1) Rayleigh waves that propagate along a piezoelectric layer including $LiNbO_3$ may be utilized as surface acoustic waves, (2) Love waves that propagate along a piezoelectric layer including $LiNbO_3$ may be utilized as surface acoustic waves, (3) the at least one first elastic wave resonator may include an acoustic velocity film multilayer structure that includes a piezoelectric layer that includes an IDT electrode provided on one main surface thereof, a high-acoustic-velocity support substrate in which an acoustic velocity of propagating bulk waves is higher than an acoustic velocity of elastic waves propagating along the piezoelectric layer, and a low-acoustic-velocity film that is located between the high-acoustic-velocity support substrate and the piezoelectric layer and in which an acoustic velocity of propagating bulk waves is lower than an acoustic velocity of elastic waves propagating along the piezoelectric layer, (4) the at least one first elastic wave resonator may include a solidly mounted resonator, or (5) the at least one first elastic wave resonator may include a film bulk acoustic resonator, and in the subsequent-stage filter section, leaky waves that propagate along a piezoelectric layer including $LiTaO_3$ may be utilized as surface acoustic waves, for example.

A Rayleigh wave spurious signal is generated at a frequency about 0.76 times the resonant frequency of the elastic wave resonator in the case where leaky waves from $LiTaO_3$ are utilized as elastic waves, for example. Therefore, the reflection coefficient of the first filter in the second pass band is able to be made large by utilizing leaky waves from $LiTaO_3$ as elastic waves in the subsequent-stage filter section of the first filter and not utilizing leaky waves from $LiTaO_3$ as elastic waves in the initial-stage filter section of the first filter.

Therefore, in the case where the first filter is a high-frequency filter and the second filter is a low-frequency filter, the connection loss of the second filter is able to be significantly reduced or prevented.

Furthermore, the first pass band may be located closer to a low-frequency side than the second pass band, in the initial-stage filter section, (1) the at least one first elastic wave resonator may include an acoustic velocity film multilayer structure that includes a piezoelectric layer that includes an IDT electrode provided on one main surface thereof, a high-acoustic-velocity support substrate in which an acoustic velocity of propagating bulk waves is higher than an acoustic velocity of elastic waves propagating along the piezoelectric layer, and a low-acoustic-velocity film that is located between the high-acoustic-velocity support substrate and the piezoelectric layer and in which an acoustic velocity of propagating bulk waves is lower than an acoustic velocity of elastic waves propagating along the piezoelectric layer, (2) leaky waves that propagate along a piezoelectric layer including $LiTaO_3$ may be utilized as surface acoustic waves, (3) Love waves that propagate along a piezoelectric layer including $LiNbO_3$ may be utilized as surface acoustic waves, (4) the at least one first elastic wave resonator may include a solidly mounted resonator, or (5) the at least one first elastic wave resonator may include a film bulk acoustic resonator, and in the subsequent-stage filter section, Rayleigh waves that propagate along a piezoelectric layer including $LiNbO_3$ may be utilized as surface acoustic waves, for example.

A high-order mode is generated at a frequency that is about 1.2 times the resonant frequency of the elastic wave resonator in the case where Rayleigh waves from $LiNbO_3$ are utilized as elastic waves, for example. Therefore, the reflection coefficient of the first filter in the second pass band is able to be made large by utilizing Rayleigh waves from $LiNbO_3$ as elastic waves in the subsequent-stage filter section of the first filter and not utilizing Rayleigh waves from $LiNbO_3$ as elastic waves in the initial-stage filter section of the first filter.

Therefore, connection loss of the second filter is able to be significantly reduced or prevented in the case where the first filter is a low-frequency filter and the second filter is a high-frequency filter.

Furthermore, the first pass band may be located closer to a low-frequency side than the second pass band, in the initial-stage filter section, (1) Rayleigh waves that propagate along a piezoelectric layer including $LiNbO_3$ may be utilized as surface acoustic waves, (2) the at least one first elastic wave resonator may include an acoustic velocity film multilayer structure that includes a piezoelectric layer that includes an IDT electrode provided on one main surface thereof, a high-acoustic-velocity support substrate in which an acoustic velocity of propagating bulk waves is higher than an acoustic velocity of elastic waves propagating along the piezoelectric layer, and a low-acoustic-velocity film that is located between the high-acoustic-velocity support substrate and the piezoelectric layer and in which an acoustic velocity of propagating bulk waves is lower than an acoustic velocity of elastic waves propagating along the piezoelectric layer, (3) leaky waves that propagate along a piezoelectric layer including $LiTaO_3$ may be utilized as surface acoustic waves, (4) the at least one first elastic wave resonator may include a solidly mounted resonator, or (5) the at least one first elastic wave resonator may include a film bulk acoustic resonator, and in the subsequent-stage filter section, Love waves that propagate along a piezoelectric layer including $LiNbO_3$ may be utilized as surface acoustic waves, for example.

A high-order mode is generated at a frequency that is about 1.2 times the resonant frequency of the elastic wave resonator in the case where Love waves from $LiNbO_3$ are utilized as elastic waves, for example. Therefore, the reflection coefficient of the first filter in the second pass band is able to be made large by utilizing Love waves from $LiNbO_3$ as elastic waves in the subsequent-stage filter section of the first filter and not utilizing Love waves from $LiNbO_3$ as elastic waves in the initial-stage filter section of the first filter.

Therefore, connection loss of the second filter is able to be significantly reduced or prevented in the case where the first filter is a low-frequency filter and the second filter is a high-frequency filter.

In addition, the at least two elastic wave resonators that define the first filter may be surface acoustic wave resonators that each include a substrate including a piezoelectric layer, and an IDT electrode that is provided on the substrate, in the first filter, leaky waves that propagate along the piezoelectric layer, which includes $LiTaO_3$, may be utilized as surface acoustic waves, and the IDT electrode of the initial-stage filter section and the IDT electrode of the subsequent-stage filter section may have different film thicknesses or duties from each other, for example.

A Rayleigh wave spurious signal is generated at a frequency that is lower than the resonant frequency of the elastic wave resonator in the case where leaky waves from $LiTaO_3$ are utilized as elastic waves. The frequency at which the Rayleigh wave spurious signal is generated in the initial-stage filter section is able to be shifted to outside the second pass band by making the film thicknesses or duties of the IDT electrodes different from each other in the initial-stage filter section and the subsequent-stage filter section. The reflection coefficient of the first filter in the second pass band is able to be made large, and connection loss of the second filter is able to be significantly reduced or prevented.

In addition, the at least two elastic wave resonators that define the first filter may be surface acoustic wave resonators that each include a substrate including a piezoelectric layer, and an IDT electrode that is provided on the substrate, and in the first filter, the elastic wave resonators may each include an acoustic velocity film multilayer structure that includes the piezoelectric layer that includes the IDT electrode provided on one main surface thereof, a high-acoustic-velocity support substrate in which an acoustic velocity of propagating bulk waves is higher than an acoustic velocity of elastic waves propagating along the piezoelectric layer, and a low-acoustic-velocity film that is located between the high-acoustic-velocity support substrate and the piezoelectric layer and in which an acoustic velocity of propagating bulk waves is lower than an acoustic velocity of elastic waves propagating along the piezoelectric layer, and any of film thicknesses of the IDT electrodes, duties of the IDT electrodes and film thicknesses of the low-acoustic-velocity films may be different from each other in the initial-stage filter section and the subsequent-stage filter section, for example.

A Rayleigh wave spurious signal is generated at a frequency that is lower than the resonant frequency of the elastic wave resonator in the case where the acoustic velocity film multilayer structure is provided. The frequency at which the Rayleigh wave spurious signal is generated in the initial-stage filter section is able to be shifted to outside the second pass band by making the film thicknesses or duties of the IDT electrodes different from each other in the initial-stage filter section and the subsequent-stage filter section. Thus, the reflection coefficient of the first filter in the second pass band is able to be made large, and connection loss of the second filter is able to be significantly reduced or prevented.

Furthermore, the at least two elastic wave resonators that define the first filter may be surface acoustic wave resonators that each include a substrate including a piezoelectric layer, an IDT electrode that is provided on the substrate, and a protective film that is provided on the IDT electrode, in the first filter, (1) Rayleigh waves that propagate along the piezoelectric layer, which includes $LiNbO_3$, or (2) Love waves that propagate along the piezoelectric layer, which includes $LiNbO_3$, may be utilized as surface acoustic waves, and any of film thicknesses of the IDT electrodes, duties of the IDT electrodes and film thicknesses of the protective films may be different from each other in the initial-stage filter section and the subsequent-stage filter section, for example.

A high-order mode is generated at a frequency that is higher than the resonant frequency of the elastic wave resonator in the case where Rayleigh waves from $LiNbO_3$ or Love waves from $LiNbO_3$ are utilized as surface acoustic waves. The frequency at which the high-order mode is generated in the initial-stage filter section is able to shifted to outside the second pass band by making the film thicknesses of the IDT electrodes, the duties of the IDT electrodes or the film thicknesses of the protective films different from each other in the initial-stage filter section and the subsequent-stage filter section. Thus, the reflection coefficient of the first filter in the second pass band is able to be made large, and connection loss of the second filter is able to be significantly reduced or prevented.

In addition, the at least two elastic wave resonators that define the first filter may be surface acoustic wave resonators that each include a substrate including a piezoelectric layer, and an IDT electrode that is provided on the substrate, in the first filter, the elastic wave resonators may each include an acoustic velocity film multilayer structure that includes the piezoelectric layer that includes the IDT electrode provided on one main surface thereof, a high-acoustic-velocity support substrate in which an acoustic velocity of propagating bulk waves is higher than an acoustic velocity of elastic waves propagating along the piezoelectric layer, and a low-acoustic-velocity film that is located between the high-acoustic-velocity support substrate and the piezoelectric layer and in which an acoustic velocity of propagating bulk waves is lower than an acoustic velocity of elastic waves propagating along the piezoelectric layer, the high-acoustic-velocity support substrate may be made of silicon crystal, and any of film thicknesses of the piezoelectric layers, film thicknesses of the low-acoustic-velocity films and silicon crystal orientations of the high-acoustic-velocity support substrates may be different from each other in the initial-stage filter section and the subsequent-stage filter section, for example.

A high-order mode is generated at a frequency that is higher than the resonant frequency of the elastic wave resonator in the case where the acoustic velocity film multilayer structure is provided. The frequency at which the high-order mode is generated in the initial-stage filter section is able to shifted to outside the second pass band by making the film thicknesses of the piezoelectric layers, the film thicknesses of the low-acoustic-velocity films or the silicon crystal orientations of the high-acoustic-velocity support substrates different from each other in the initial-stage filter section and the subsequent-stage filter section. Thus, the reflection coefficient of the first filter in the second pass band is able to be made large, and connection loss of the second filter is able to be significantly reduced or prevented.

Furthermore, the at least two elastic wave resonators that define the first filter may be surface acoustic wave resonators that each include a substrate including a piezoelectric layer, and an IDT electrode that is provided on the substrate, in the first filter, (1) leaky waves that propagate along the piezoelectric layer, which includes $LiTaO_3$, or (2) Love waves that propagate along the piezoelectric layer, which includes $LiNbO_3$, may be utilized as surface acoustic waves, and film thicknesses of the IDT electrodes may be different from each other in the initial-stage filter section and the subsequent-stage filter section, for example.

Bulk waves (unwanted waves) are generated at a higher frequency than the resonant frequency of the elastic wave resonator in the case where leaky waves from $LiTaO_3$ or Love waves from $LiNbO_3$ are utilized as surface acoustic waves. The frequency at which the bulk waves are generated in the initial-stage filter section is able to be shifted to outside the second pass band by making the film thicknesses of the IDT electrodes different from each other in the initial-stage filter section and the subsequent-stage filter section. Thus, the reflection coefficient of the first filter in the second pass band is able to be made large, and connection loss of the second filter is able to be significantly reduced or prevented.

In addition, the multiplexer may further include a third input/output terminal; and a third filter that includes at least two elastic wave resonators that are located between the common terminal and the third input/output terminal, the third filter including a third pass band that is at a different frequency from the second pass band. The third filter includes the initial-stage filter section, and a second subsequent-stage filter section that includes a third elastic wave resonator, which is different from the at least one first elastic wave resonator of the initial-stage filter section, that is located on the third input/output terminal side among the at least two elastic wave resonators. The first filter and the third filter may further include a switch that is located between the initial-stage filter section, and the subsequent-stage filter section and the second subsequent-stage filter section, and that switches a connection between the initial-stage filter section and the subsequent-stage filter section, and a connection between the initial-stage filter section and the second subsequent-stage filter section. A reflection coefficient of the initial-stage filter section in the second pass band when the initial-stage filter section is viewed from the common terminal side as a single component may be larger than a reflection coefficient of the second subsequent-stage filter section in the second pass band when the second subsequent-stage filter section is viewed from the common terminal side as a single component, for example.

With the above configuration, even in a case where the frequency bands of the first filter and the third filter overlap, the connection loss of the second filter is able to be significantly reduced or prevented without causing the insertion losses of the first filter and the third filter to deteriorate by switching the switch. In addition, since the first filter and the third filter share the initial-stage filter section, a significant reduction in the overall size of the multiplexer is able to be achieved.

Furthermore, a high-frequency front-end circuit according to a preferred embodiment of the present invention includes any of the above-described multiplexers; and an amplification circuit that is connected to the multiplexer.

With the above configuration, a high-frequency front-end circuit is able to be provided that is able to significantly reduce or prevent the connection loss of the second filter.

In addition, a communication device according to a preferred embodiment of the present invention includes an RF signal processing circuit that processes a high-frequency signal transmitted or received by an antenna element; and the above-described high-frequency front-end circuit that transmits the high-frequency signal between the antenna element and the RF signal processing circuit.

With the above configuration, a communication device is able to be provided that is able to significantly reduce or prevent connection loss of the second filter.

The multiplexers, the high-frequency front-end circuits, and the communication devices according to preferred embodiments of the present invention are able to significantly reduce or prevent propagation loss of a high-frequency signal while achieving a significant reduction in size.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 8B shows combinations of the configurations of an initial-stage filter section and a subsequent-stage filter section according to the second modification of the first preferred embodiment of the present invention.

FIG. 9A is a diagram showing bulk wave leakage in a high-frequency region of a multiplexer according to a third modification of the first preferred embodiment of the present invention.

FIG. 9B shows combinations of the configurations of an initial-stage filter section and a subsequent-stage filter section according to the third modification of the first preferred embodiment of the present invention.

FIG. 10A is a diagram showing generation of a spurious signal in a low-frequency region of a multiplexer according to a fourth modification of the first preferred embodiment of the present invention.

FIG. 10B shows combinations of the configurations of an initial-stage filter section and a subsequent-stage filter section according to the fourth modification of the first preferred embodiment of the present invention.

FIG. 11B shows combinations of the configurations of an initial-stage filter section and a subsequent-stage filter section according to the fifth modification of the first preferred embodiment of the present invention.

FIG. 12B shows parameters that are used to make the structures of an initial-stage filter section and a subsequent-stage filter section according to a sixth modification of the first preferred embodiment of the present invention different from each other.

FIG. 12C shows parameters that are used to make the structures of an initial-stage filter section and a subsequent-stage filter section according to a seventh modification of the first preferred embodiment of the present invention different from each other.

FIG. 13 shows parameters that are used to make the structures of an initial-stage filter section and a subsequent-stage filter section according to an eighth modification of the first preferred embodiment of the present invention different from each other.

DETAILED DESCRIPTION OF THE PREFERRED EMBODIMENTS

Figure 1A:
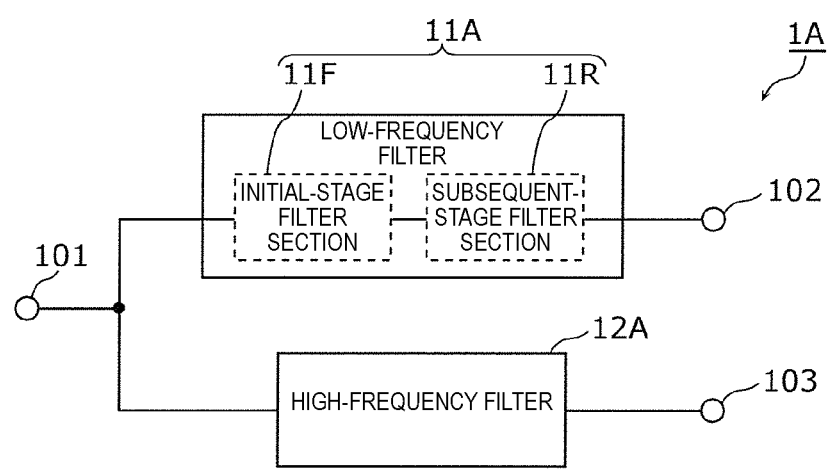
FIG. 1A is a diagram of the circuit configuration of a multiplexer according to a first preferred embodiment of the present invention.

Hereafter, preferred embodiments of the present invention will be described in detail with reference to the drawings. The preferred embodiments described hereafter are general or specific examples of the present invention. The numerical values, shapes, materials, elements, arrangements of the elements, the ways in which the elements are connected and the like described with respect to the following preferred embodiments are merely examples and are not intended to limit the present invention. Furthermore, elements that are not described in the independent claims among elements described in the following preferred embodiments are described as arbitrary elements. In addition, the sizes or size ratios of the elements shown in the drawings are not necessarily strictly accurate. It is to be noted that the preferred embodiments described in this specification are merely examples, and that the configurations, elements, features, etc. in the preferred embodiments are able to be partly replaced or combined between different preferred embodiments.

First Preferred Embodiment

FIG. 1A is a diagram of the circuit configuration of a multiplexer 1A according to a first preferred embodiment of the present invention. As shown in FIG. 1A, the multiplexer 1A includes a low-frequency filter 11A, a high-frequency filter 12A, a common terminal 101, and input/output terminals 102 and 103. The multiplexer 1A is a composite elastic wave filter device that includes the low-frequency filter 11A and the high-frequency filter 12A, which are connected to each other at the common terminal 101.

For example, the common terminal 101 is able to be connected to an antenna element, and the input/output terminals 102 and 103 are able to be connected to a high-frequency signal processing circuit via an amplification circuit.

The low-frequency filter 11A is a first filter that is located between the common terminal 101 and the input/output terminal 102 (first input/output terminal) and has a first pass band. The low-frequency filter 11A includes an initial-stage filter section 11F and a subsequent-stage filter section 11R.

The initial-stage filter section 11F includes at least one elastic wave resonator that is located on the common terminal 101 side among at least two elastic wave resonators. On the other hand, the subsequent-stage filter section 11R includes an elastic wave resonator that is located on the input/output terminal 102 side and is an elastic wave resonator other than the at least one elastic wave resonator among the at least two elastic wave resonators that define the initial-stage filter section 11F. The structure of the elastic wave resonators of the initial-stage filter section 11F and the subsequent-stage filter section 11R is described in detail in FIG. 3 onwards.

The high-frequency filter 12A is a second filter that is located between the common terminal 101 and the input/output terminal 103 (second input/output terminal) and has a second pass band that is located closer to the high-frequency side than the first pass band.

Figure 1B:
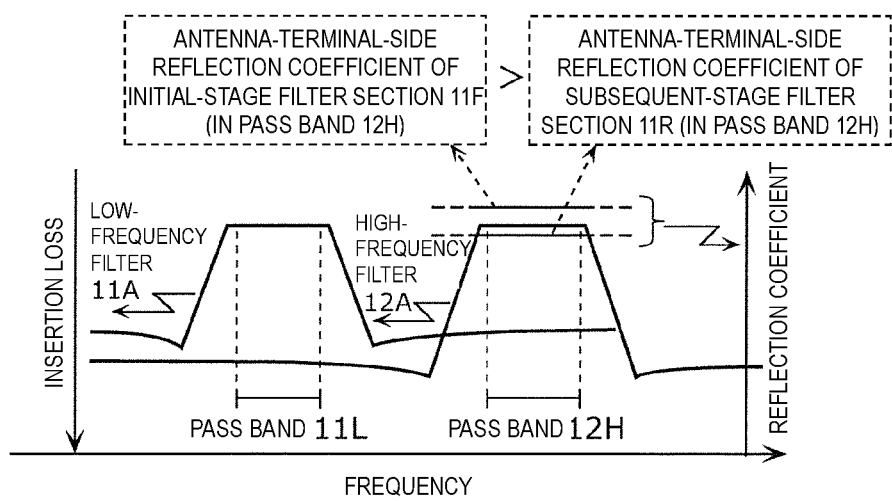
FIG. 1B is a diagram showing a reflection characteristic of the multiplexer according to the first preferred embodiment of the present invention.

FIG. 1B is a diagram showing a reflection characteristic of the multiplexer 1A according to the first preferred embodiment. FIG. 1B shows the filter bandpass characteristics of the low-frequency filter 11A and the high-frequency filter 12A, and the reflection characteristics of the initial-stage filter section 11F and the subsequent-stage filter section 11R. Here, in the multiplexer 1A according to this preferred embodiment, the reflection coefficient of the initial-stage filter section 11F in a pass band 12H (second pass band) when the initial-stage filter section 11F is viewed from the common terminal 101 side as a single component is larger than the reflection coefficient of the subsequent-stage filter section 11R in the pass band 12H (second pass band) when the subsequent-stage filter section 11R is viewed from the common terminal 101 side as a single component.

Figure 2A:
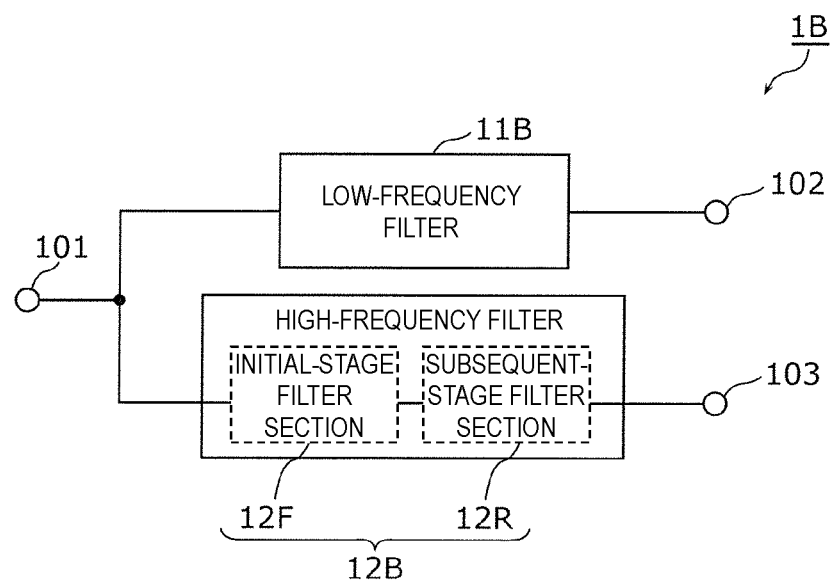
FIG. 2A is a diagram of the circuit configuration of a multiplexer according to a first modification of the first preferred embodiment of the present invention.

A filter that includes an initial-stage filter section and a subsequent-stage filter section is not limited to a low-frequency filter, and the first filter may instead be a high-frequency filter, for example, as shown in FIG. 2A.

FIG. 2A is a diagram of the circuit configuration of a multiplexer 1B according to a first modification of the first preferred embodiment. As shown in FIG. 2A, the multiplexer 1B includes a low-frequency filter 11B, a high-frequency filter 12B, a common terminal 101, and input/output terminals 102 and 103. The multiplexer 1B is a composite elastic wave filter device that includes the low-frequency filter 11B and the high-frequency filter 12B that are connected to each other at the common terminal 101.

The high-frequency filter 12B is a first filter that is located between the common terminal 101 and the input/output terminal 103 (first input/output terminal) and has a first pass band. The high-frequency filter 12B includes an initial-stage filter section 12F and a subsequent-stage filter section 12R.

The initial-stage filter section 12F includes at least one elastic wave resonator that is located on the common terminal 101 side among two or more elastic wave resonators. On the other hand, the subsequent-stage filter section 12R includes an elastic wave resonator that is located on the input/output terminal 103 side and is an elastic wave resonator other than the at least one elastic wave resonator among the at least two elastic wave resonators that define the initial-stage filter section 12F.

The low-frequency filter 11B is a second filter that is located between the common terminal 101 and the input/output terminal 102 (third input/output terminal) and has a second pass band that is located closer to the low-frequency side than the first pass band.

Figure 2B:
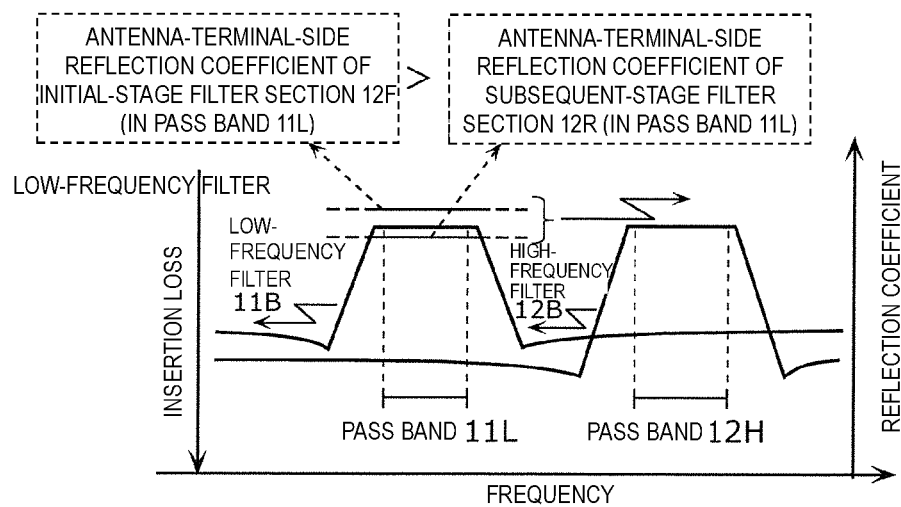
FIG. 2B is a diagram showing a reflection characteristic of the multiplexer according to the first modification of the first preferred embodiment of the present invention.

FIG. 2B is a diagram showing a reflection characteristic of the multiplexer 1B according to the first modification of the first preferred embodiment. FIG. 2B shows the filter bandpass characteristics of the high-frequency filter 12B and the low-frequency filter 11B, and the reflection characteristics of the initial-stage filter section 12F and the subsequent-stage filter section 12R. Here, in the multiplexer 1B according to this modification, the reflection coefficient of the initial-stage filter section 12F in a pass band 11L (second pass band) when the initial-stage filter section 12F is viewed from the common terminal 101 side as a single component is larger than the reflection coefficient of the subsequent-stage filter section 12R in the pass band 11L (second pass band) when the subsequent-stage filter section 12R is viewed from the common terminal 101 side as a single component.

Figure 3:
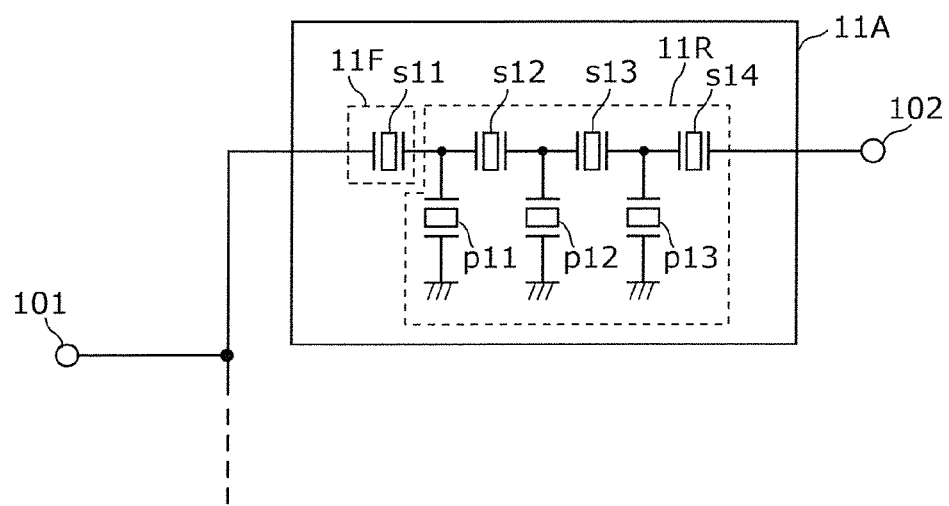
FIG. 3 is a diagram of the circuit configuration of a low-frequency filter according to the first preferred embodiment of the present invention.

FIG. 3 is an example of a circuit configuration diagram of the low-frequency filter 11A of the multiplexer 1A according to the first preferred embodiment. As shown in FIG. 3, the low-frequency filter 11A includes series arm resonators s11, s12, s13, and s14, and parallel arm resonators p11, p12, and p13. The series arm resonators s11, s12, s13, and s14 are connected to each other in order from the common terminal 101 side in a series arm that connects the common terminal 101 and the input/output terminal 102 to each other. In addition, the parallel arm resonators p11, p12, and p13 are connected to parallel arms that connect the series arm and ground terminals to each other. As a result of the series arm resonators s11, s12, s13, and s14 and the parallel arm resonators p11, p12, and p13 being configured as described above, the low-frequency filter 11A defines a ladder band pass filter. In addition, the low-frequency filter 11A is not limited to being a ladder band pass filter, for example. The configuration of the resonators of the low-frequency filter 11A will be described below with respect to FIGS. 15A to 16B.

Surface acoustic wave (SAW) resonators, solidly mounted resonators (SMRs), or film bulk acoustic resonators (FBARs) that utilize bulk acoustic waves (BAWs) may be included as the structures of the series arm resonators s11, s12, s13, and s14 and the parallel arm resonators p11, p12, and p13, for example.

Here, the initial-stage filter section 11F includes the series arm resonator s11 that is closest to the common terminal 101 among the series arm resonators s11, s12, s13, and s14 and the parallel arm resonators p11, p12, and p13, and the subsequent-stage filter section 11R includes the resonators other than the series arm resonator s11 of the initial-stage filter section 11F, in other words, the series arm resonators s11, s12 s13, and s14 and the parallel arm resonators p11, p12, and p13.

In addition, the number of filters that are connected to each other at the common terminal 101 in the multiplexers 1A and 1B according to this preferred embodiment is not limited to two, and may be three or more, for example.

Figure 4:
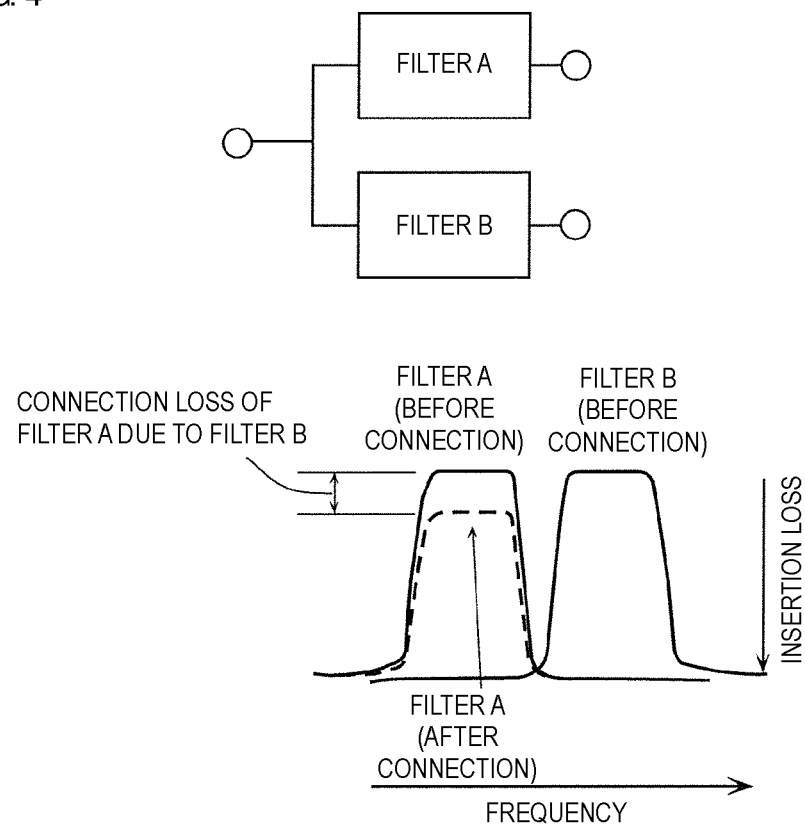
FIG. 4 is a diagram showing an issue that arises when two filters are connected to each other at a common terminal.

FIG. 4 is a diagram showing an issue that arises when two filters (filter A and filter B) are connected to each other at a common terminal. As shown in FIG. 4, a multiplexer includes a filter A (pass band A) and a filter B (pass band B) connected to each other at a common terminal. The insertion loss of the multiplexer in this case is described below.

The insertion loss of the filter A in the pass band A is degraded by the effect of the filter B in addition to the insertion loss of the filter A itself. The amount of degradation of the insertion loss of the filter A caused by the filter B is called "connection loss". Here, the connection loss of the filter A is affected by the reflection characteristics of the filter B in the pass band A.

Figure 5:
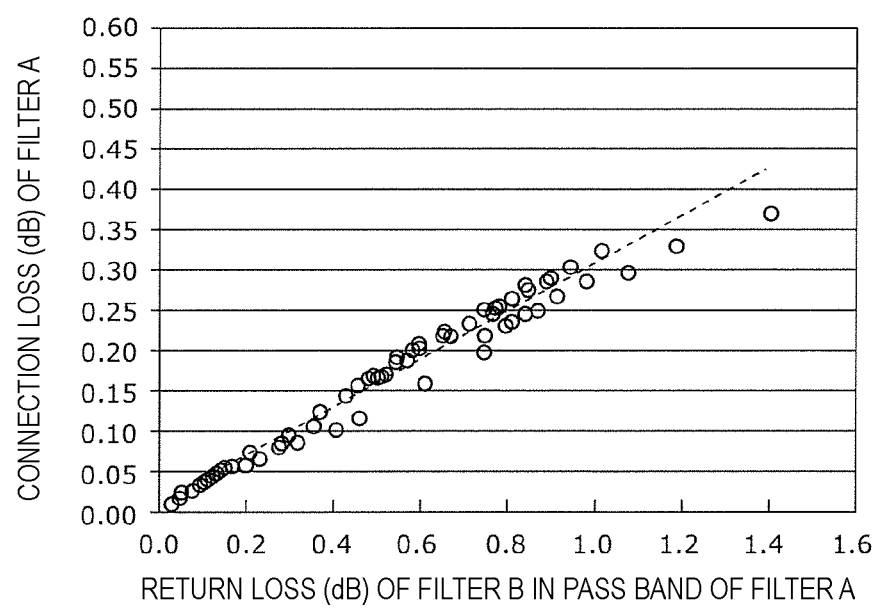
FIG. 5 is a graph that shows the relationship between the pre-connection return loss of one filter and the connection loss of another filter.

FIG. 5 is a graph that shows the relationship between the pre-connection return loss of the filter B and the connection loss of the filter A. The horizontal axis in FIG. 5 represents the return loss of the filter B before the filter B is connected to the filter A at the common terminal when the filter B is viewed from the common terminal side, and the vertical axis in FIG. 5 represents the connection loss of the filter A (amount of degradation of insertion loss in pass band A) when the filter A is connected to the filter B at the common terminal. As shown in FIG. 5, the connection loss of the filter A decreases as the pre-connection return loss of the filter B becomes smaller. In other words, the connection loss of the filter A decreases as the pre-connection reflection coefficient of the filter B increases.

Next, the contribution of each elastic wave resonator of the filter to the reflection characteristic will be described.

Figure 6A:
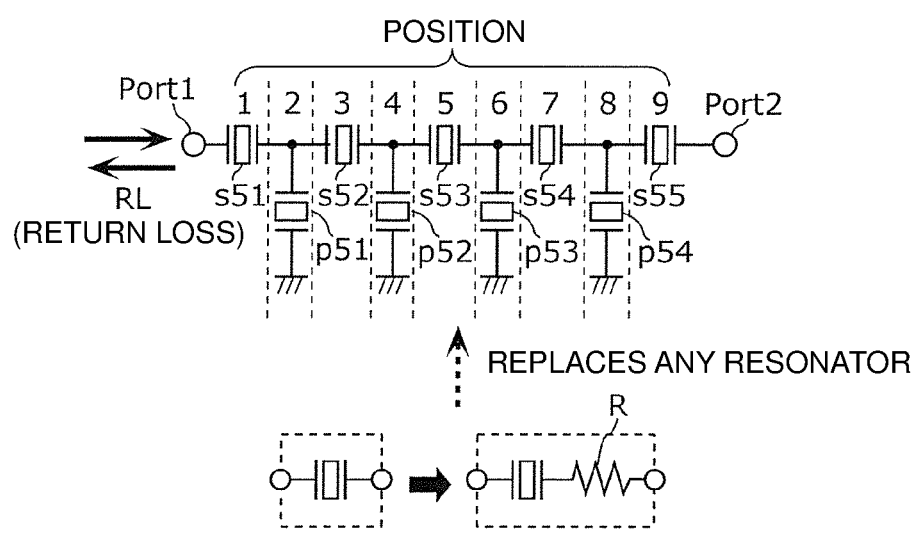
FIG. 6A is a diagram of a circuit that measures return loss in a state where a resistance component is added to each resonator of a ladder filter.

FIG. 6A is a diagram of a circuit that measures return loss in a state where a resistance component R is added to each elastic wave resonator of a ladder filter. When the resistance component R is added to any of series arm resonators s51, s52, s53, s54, and s55 and parallel arm resonators p51, p52, p53, and p54 of the ladder filter, the impedance of the resonator to which the resistance component R has been added becomes higher, and the return loss increases.

Figure 6B:
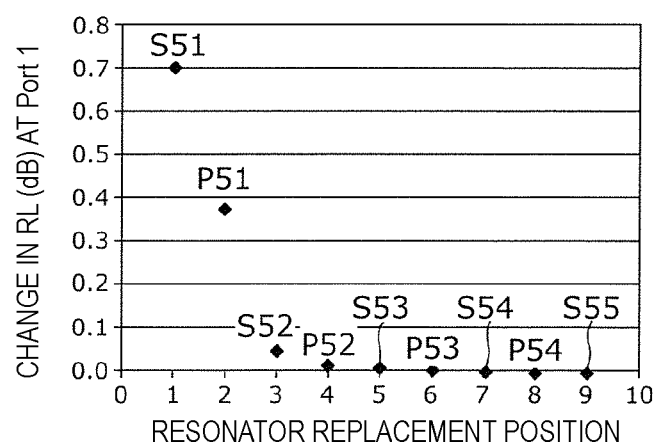
FIG. 6B is a graph that shows the relationship between the position of each resonator to which a resistance component is added and the change in return loss.

FIG. 6B is a graph that shows the relationship between the position of the resonator to which a resistance component R has been added and the change in return loss. The horizontal axis in FIG. 6B represents the position of the resonator to which the resistance component R has been added (positions 1 to 9 in FIG. 6A), and the vertical axis in FIG. 6B represents the change in return loss when the ladder filter is viewed from Port1. As shown in FIG. 6B, the change in return loss increases as the resonator becomes closer to Port1 (connection side), and the change in return loss decreases as the resonator becomes further from Port1 (connection side), until there is no effect or substantially no effect on the return loss.

In other words, it is preferable, for example, to make the return loss small (make reflection coefficient large) in the pass band A in the resonator of the filter B that is adjacent to or in a vicinity of the connection side of the filter B in order to significantly reduce or prevent the connection loss of the filter A. On the other hand, it is preferable, for example, to provide filter characteristics for the filter B, for example, the bandpass characteristic, the attenuation characteristic, the temperature characteristics, the bandwidth and the like in accordance with the preferred specifications and the like while significantly improving the reflection characteristic of the filter B as described above. Depending on the configurations of the elastic wave resonators, there are cases where it may not be possible to obtain both the desired reflection characteristic and the desired filter characteristics, for example.

The inventors of preferred embodiments of the present invention discovered a structure of the filter B that prioritizes making the reflection coefficient large in the initial-stage filter section, which greatly affects the reflection characteristic, and that provides filter characteristics, for example, the bandpass characteristic, the attenuation characteristic, the temperature characteristics, and the bandwidth in the subsequent-stage filter section, which have little effect on the reflection characteristic.

As shown in FIG. 3, in the multiplexer 1A according to this preferred embodiment, the initial-stage filter section 11F includes the series arm resonator s11, which is located on the common terminal 101 side, and the subsequent-stage filter section 11R includes the series arm resonators s12, s13, and s14 and the parallel arm resonators p11, p12, and p13, which are located on the input/output terminal 102 side. Here, the reflection coefficient of the initial-stage filter section 11F in the second pass band (of the high-frequency filter 12A) is larger than the reflection coefficient of the subsequent-stage filter section 11R in the second pass band (of the high-frequency filter 12A), and therefore, the return loss of the first filter in the second pass band when the first filter (the low-frequency filter 11A) is viewed from the common terminal 101 side, is able to be further significantly reduced or prevented. Thus, since the connection loss of the high-frequency filter 12A is able to be significantly reduced or prevented, the insertion loss of the entire multiplexer 1A is able to be significantly reduced or prevented.

In addition, from the results shown in FIG. 6B, the initial-stage filter section may include, for example, of the series arm resonator s51 and the parallel arm resonator p51, which have a large effect on the reflection characteristic, from among the series arm resonators s51, s52, s53, s54, and s55 and the parallel arm resonators p51, p52, p53, and p54. In other words, the initial-stage filter section may include two elastic wave resonators that are adjacent to or in a vicinity of the common terminal among a plurality of elastic wave resonators.

On the other hand, from the viewpoint of contributing to an increase of the reflection coefficient of only the minimum or substantially minimum number of elastic wave resonators that affect the connection loss, and significantly improving the filter characteristics of the rest of the elastic wave resonators, it is preferable for the initial-stage filter section 11F to include only the series arm resonator s11 and for the subsequent-stage filter section 11R to include the rest of the resonators as in this preferred embodiment, for example.

Hereafter, combinations of specific configurations that increase the reflection coefficient in the initial-stage filter section and significantly improve the filter characteristics, for example, the bandpass characteristic, the attenuation characteristic, the temperature characteristics, the bandwidth and the like in the subsequent-stage filter section will be described.

First, an example of the structure of an elastic wave resonator will be described.

Figure 7:
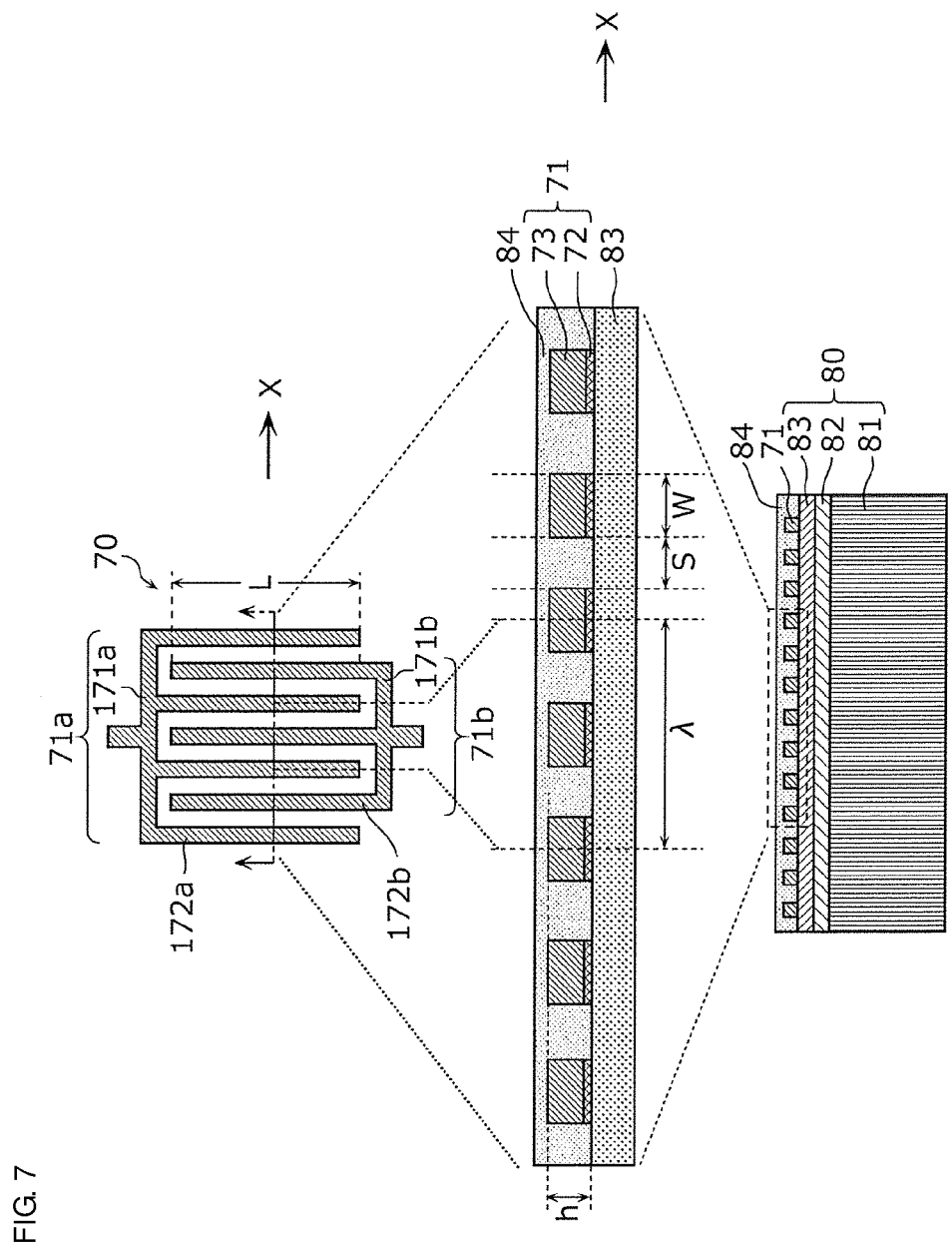
FIG. 7 shows examples of a plan view and a sectional view that schematically show a resonator of a multiplexer according to the first preferred embodiment of the present invention.

FIG. 7 shows examples of a plan view and a sectional view that schematically show a resonator of the multiplexer according to the first preferred embodiment. FIG. 7 shows a case in which the elastic wave resonators (series arm resonators and parallel arm resonators) according to this preferred embodiment are surface acoustic wave (SAW) resonators, for example. FIG. 7 shows a schematic plan view and a schematic sectional view of the structure of the series arm resonator s11 from among the plurality of resonators of the low-frequency filter 11A shown in FIG. 3. In addition, the purpose of the series arm resonator s11 shown in FIG. 7 is to show one example of the structure of the plurality of resonators, and the number, length, and the like of the electrode fingers of the electrodes are not limited to those shown in FIG. 7.

Each resonator of the low-frequency filter 11A includes a substrate 80 that includes a piezoelectric layer 83 and comb-shaped interdigital transducer (IDT) electrodes 71a and 71b.

As shown in the plan view of FIG. 7, the pair of IDT electrodes 71a and 71b, which face each other, are provided on the piezoelectric layer 83. The IDT electrode 71a includes a plurality of electrode fingers 172a, which are parallel or substantially parallel to each other, and a busbar electrode 171a that connects the plurality of electrode fingers 172a to each other. In addition, the IDT electrode 71b includes a plurality of electrode fingers 172b, which are parallel or substantially parallel to each other, and a busbar electrode 171b that connects the plurality of electrode fingers 172b to each other. The plurality of electrode fingers 172a and 172b extend in a direction that is orthogonal or substantially orthogonal to an X-axis direction.

Furthermore, as shown in the sectional view of FIG. 7, the IDT electrodes 71, which include the plurality of electrode fingers 172a and 172b and the busbar electrodes 171a and 171b, have a multilayer structure including an adhesive layer 72 and a main electrode layer 73.

The adhesive layer 72 is a layer that provides adhesion between the piezoelectric layer 83 and the main electrode layer 73, and Ti is included as the material of the adhesive layer 72, for example. The film thickness of the adhesive layer 72 is about 10 nm, for example.

An Al material including about 1% Cu preferably is included as the material of the main electrode layer 73, for example. The film thickness of the main electrode layer 73 preferably is about 130 nm, for example.

A protective film 84 covers the IDT electrodes 71a and 71b. The protective film 84 is a layer that protects the main electrode layer 73 from the external environment, adjusts the frequency-temperature characteristics, provides moisture resistance, and the like, and is a film including silicon dioxide as a main component, for example. The film thickness of the protective film 84 preferably is about 30 nm, for example.

The materials of the adhesive layer 72, the main electrode layer 73 and the protective film 84 are not limited to those described above, for example. In addition, the IDT electrodes 71 do not need to have a multilayer structure, for example. The IDT electrodes 71 may be made of a metal such as Ti, Al, Cu, Pt, Au, Ag or Pd, or an alloy of such metals, and may include a plurality of multilayer bodies including any of the metals or an alloy of any of the metals, for example. In addition, the protective film 84 may be omitted, for example.

Next, the multilayer structure of the substrate 80 will be described.

As shown in the lower portion of FIG. 7, the substrate 80 includes a high-acoustic-velocity support substrate 81, a low-acoustic-velocity film 82 and the piezoelectric layer 83, and has a structure in which the high-acoustic-velocity support substrate 81, the low-acoustic-velocity film 82, and the piezoelectric layer 83 are stacked in this order (acoustic velocity film multilayer structure).

For example, the piezoelectric layer 83 preferably includes a 42° Y-cut X-propagation LiTaO₃ piezoelectric single crystal or piezoelectric ceramic (lithium tantalate single crystal cut along a plane having, as a normal line, an axis rotated by 42° from a Y axis about an X axis, and in which a surface acoustic wave propagates in an X-axis direction or ceramic). In this case, the elastic wave resonator utilizes leaky waves as elastic waves.

Alternatively, the piezoelectric layer 83 preferably includes a 128° Y-cut X-propagation LiNbO₃ piezoelectric single crystal or piezoelectric ceramic, for example. In this case, the elastic wave resonator utilizes Rayleigh waves as elastic waves.

Alternatively, the piezoelectric layer 83 includes a Y-cut X-propagation LiNbO₃ piezoelectric single crystal or piezoelectric ceramic, for example. In this case, the elastic wave resonator utilizes Love waves as elastic waves.

In addition, the single crystal material, cut angles, and multilayer structure of the piezoelectric layer 83 are appropriately selected in accordance with the preferred specifications of the filter (filter characteristics, for example, bandpass characteristic, attenuation characteristic, temperature characteristics and bandwidth), and the like, for example.

The high-acoustic-velocity support substrate 81 preferably is a substrate that supports the low-acoustic-velocity film 82, the piezoelectric layer 83, and the IDT electrodes 71. In addition, the high-acoustic-velocity support substrate 81 is a substrate in which the acoustic velocity of a bulk wave propagating inside the high-acoustic-velocity support substrate 81 is higher than the acoustic velocity of an elastic wave, for example, surface acoustic wave or a boundary wave propagating along the piezoelectric layer 83, and, due to the high-acoustic-velocity support substrate 81, a surface acoustic wave is confined or substantially confined to a portion of the substrate 80 where the piezoelectric layer 83 and the low-acoustic-velocity film 82 are stacked and does not leak or substantially does not leak into the region below the high-acoustic-velocity support substrate 81. The high-acoustic-velocity support substrate 81 preferably is a silicon substrate and has a thickness of about 200 µm, for example. Furthermore, the high-acoustic-velocity support substrate 81 may include any of (1) aluminum nitride, aluminum oxide, silicon carbide, silicon nitride, silicon, sapphire, or a piezoelectric body such as lithium tantalate, lithium niobate or quartz, (2) any of various ceramics such as alumina, zirconia, cordierite, mullite, steatite or forsterite, (3) magnesia or diamond, (4) a material including any of the above-listed materials as a main component, and (5) a material including a mixture of any of the above-listed materials as a main component, for example.

The low-acoustic-velocity film 82 is a film in which the acoustic velocity of a bulk wave propagating inside the low-acoustic-velocity film 82 is lower than the acoustic velocity of an elastic wave propagating along the piezoelectric layer 83, and the low-acoustic-velocity film 82 is disposed between the piezoelectric layer 83 and the high-acoustic-velocity support substrate 81. Leaking of energy of surface acoustic waves to outside the IDT electrodes is significantly reduced or prevented by this structure and energy of elastic waves is concentrated in a low-acoustic-velocity medium. The low-acoustic-velocity film 82 is a film including silicon dioxide as a main component, for example. The thickness of the low-acoustic-velocity film 82 preferably is about 500 nm, for example.

According to the above-described acoustic velocity film multilayer structure of the substrate 80, the Q value at the resonant frequency and anti-resonant frequency is able to be significantly improved compared with a structure of the related art in which a piezoelectric substrate is implemented as a single layer. That is, a surface acoustic wave resonator with a high Q value is able to be provided, and therefore, it is possible to provide a filter with small insertion loss including the surface acoustic wave resonator.

The high-acoustic-velocity support substrate 81 may include a structure in which a support substrate and a high-acoustic-velocity film in which the acoustic velocity of a propagating bulk wave is higher than the acoustic velocity of an elastic wave, for example, a surface acoustic wave or a boundary wave propagating along the piezoelectric layer 83 are stacked one on top of the other. In this case, sapphire, a piezoelectric body such as lithium tantalate, lithium niobate or quartz, any of various ceramics such as alumina, magnesia, silicon nitride, aluminum nitride, silicon carbide, zirconia, cordierite, mullite, steatite or forsterite, a dielectric such as glass, a semiconductor such as silicon or gallium nitride, or a resin substrate may be included as the material of the support substrate, for example. Furthermore, any of a variety of high-acoustic-velocity materials such as aluminum nitride, aluminum oxide, silicon carbide, silicon nitride, silicon oxynitride, a DLC film, diamond, a substance including any of the above-listed materials as a main component, or a substance including a mixture of any of the above listed materials as a main component may be included as the material of the high-acoustic-velocity film, for example.

In addition, although an example is provided in the above description in which the IDT electrodes 71 that define the elastic wave resonators are provided on the substrate 80 that includes the piezoelectric layer 83, the substrate on which the IDT electrodes 71 are provided may instead be a piezoelectric substrate including a single layer that is the piezoelectric layer 83, for example. In this case, the piezoelectric substrate is preferably made of a piezoelectric single crystal, for example, $LiTaO_3$ or $LiNbO_3$.

In addition, so long as the substrate on which the IDT electrodes 71 are provided includes the piezoelectric layer 83, the substrate may include a structure other than a structure entirely defined by a piezoelectric layer and may include a structure in which a piezoelectric layer is stacked on a support substrate, for example.

Next, the design parameters of the IDT electrodes 71 will be described. The wavelength of a surface acoustic wave resonator is defined as a wavelength λ that is the period at which the plurality of electrode fingers 172a or 172b that define the IDT electrode 71 in the center of FIG. 7 repeat. In addition, the electrode pitch is about ½ the wavelength λ, and is defined as (W+S), where W is the line width of the electrode fingers 172a and 172b that define the IDT electrodes 71a and 71b and S is the spacing between an electrode finger 172a and an electrode finger 172b that are adjacent to or in a vicinity of each other. Furthermore, as shown in the upper portion of FIG. 7, an intersection width L of the IDT electrodes is an overlapping electrode finger length over which the electrode fingers 172a of the IDT electrode 71a and the electrode fingers 172b of the IDT electrode 71b overlap when viewed from the X-axis direction. In addition, the electrode duty of the resonators is a line width occupation ratio of the plurality of electrode fingers 172a and 172b, and is a ratio between the line width of the plurality of electrode fingers 172a and 172b and the sum of the line width and the spacing of the plurality of electrode fingers 172a and 172b, defined as W(W+S).

Hereafter, combinations of specific configurations that increase the reflection coefficient in the initial-stage filter section and significantly improve the filter characteristics, for example, the bandpass characteristic, the attenuation characteristic, the temperature characteristics, the bandwidth and the like in the subsequent-stage filter section will be described.

Figure 8A:
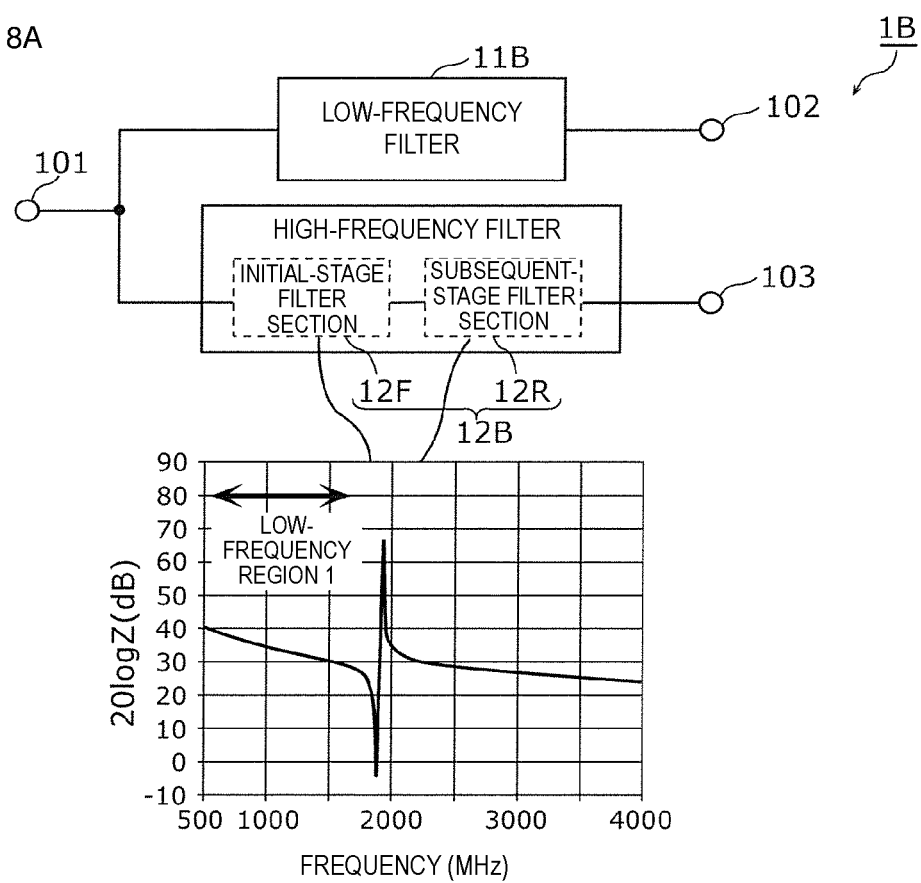
FIG. 8A is a diagram showing a reflection characteristic of a multiplexer according to a second modification of the first preferred embodiment of the present invention in a low-frequency region.

FIG. 8A is a diagram showing the reflection characteristic of a multiplexer 1B according to a second modification of the first preferred embodiment in a low-frequency region 1. As shown in the lower portion of FIG. 8A, the resonance point at which the impedance has a minimum or substantially minimum value and the anti-resonant point at which the impedance has a maximum or substantially maximum value are able to be determined in the impedance characteristic of an elastic wave resonator. Here, in the region including frequencies lower than the resonance point (low-frequency region 1 in FIG. 8A), the impedance differs depending on the structure of the elastic wave resonator, and the reflection characteristics become better or worse depending on the size of the impedance. More specifically, the return loss is smaller in the low-frequency region 1 than in the case of an SMR or an FBAR in a structure in which any of (1) Rayleigh waves that propagate along a piezoelectric layer including $LiNbO_3$, (2) leaky waves that propagate along a piezoelectric layer including $LiTaO_3$ and (3) Love waves that propagate along a piezoelectric layer including $LiNbO_3$ are utilized as surface acoustic waves, and in (4) the acoustic velocity film multilayer structure described above.

FIG. 8B shows combinations of the configurations of the initial-stage filter section 12F and the subsequent-stage filter section 12R according to the second modification of the first preferred embodiment.

From the return loss relationship described above, as shown in FIG. 8B, the initial-stage filter section 12F of the high-frequency filter 12B of the multiplexer 1B according to the first modification may include a structure in which any of (1) Rayleigh waves that propagate along a piezoelectric layer including LiNbO$_3$, (2) leaky waves that propagate along a piezoelectric layer including LiTaO$_3$ and (3) Love waves that propagate along a piezoelectric layer including LiNbO$_3$ are utilized as surface acoustic waves, for example.

In the multiplexer 1B, the reflection coefficient of the initial-stage filter section 12F of the high-frequency filter 12B in the second pass band (pass band of low-frequency filter 11B) is able to be made larger than the reflection coefficient of the subsequent-stage filter section 12R in the second pass band (pass band of low-frequency filter 11B). Thus, the connection loss of the low-frequency filter 11B is able to be significantly reduced or prevented.

On the other hand, the elastic wave resonators of the subsequent-stage filter section 12R may be include SMRs or FBARs, for example.

Thus, low loss and steep pass band characteristics are able to be provided in the high-frequency filter 12B by the configuration of the subsequent-stage filter section 12R while the reflection coefficient of the high-frequency filter 12B is increased by the configuration of the initial-stage filter section 12F.

Furthermore, as shown in FIG. 8B, the elastic wave resonator of the initial-stage filter section 12F may include the above-described acoustic velocity film multilayer structure, and the elastic wave resonators of the subsequent-stage filter section 12R may include SMRs or FBARs, for example.

In the multiplexer 1B, the reflection coefficient of the initial-stage filter section 12F of the high-frequency filter 12B in the second pass band (pass band of low-frequency filter 11B) is able to be made larger than the reflection coefficient of the subsequent-stage filter section 12R in the second pass band (pass band of low-frequency filter 11B). Therefore, the connection loss of the low-frequency filter 11B is able to be significantly reduced or prevented. Low loss and steep pass band characteristics are able to be provided in the high-frequency filter 12B by the configuration of the subsequent-stage filter section 12R while the reflection coefficient of the high-frequency filter 12B is increased by the configuration of the initial-stage filter section 12F.

FIG. 9A is a diagram showing bulk wave leakage in a high-frequency region 1 of a multiplexer 1A according to a third modification of the first preferred embodiment. As shown in the lower portion of FIG. 9A, in the region including frequencies higher than the anti-resonance point of the elastic wave resonator (high-frequency region 1 in FIG. 9A), a change in impedance is generated due to bulk wave leakage (unwanted waves), and the reflection characteristic may become better or worse depending on the change in the impedance. More specifically, return loss due to bulk wave leakage in the high-frequency region 1 increases in the order of (1) return loss in a structure in which Rayleigh waves that propagate along a piezoelectric layer including LiNbO$_3$ are utilized as elastic waves, an SMR, or an FBAR, (2) return loss in the acoustic velocity film multilayer structure, (3) return loss in a structure in which leaky waves that propagate along a piezoelectric layer including LiTaO$_3$ are utilized as elastic waves, and (4) return loss in a structure in which Love waves that propagate along a piezoelectric layer including LiNbO$_3$ are utilized as elastic waves.

FIG. 9B shows combinations of the configurations of the initial-stage filter section 11F and the subsequent-stage filter section 11R according to the third modification of the first preferred embodiment.

From the above-described return loss ranking, as shown in FIG. 9B, in the initial-stage filter section 11F of the low-frequency filter 11A of the multiplexer 1A, (1) a structure in which Rayleigh waves that propagate along a piezoelectric layer including LiNbO$_3$ are utilized as surface acoustic waves may be provided, (2) the elastic wave resonator may include an SMR, or (3) the elastic wave resonator may include an FBAR, for example.

In the multiplexer 1A, the reflection coefficient of the initial-stage filter section 11F of the low-frequency filter 11A in the second pass band (pass band of high-frequency filter 12A) is able to be made larger than the reflection coefficient of the subsequent-stage filter section 11R of the low-frequency filter 11A in the second pass band (pass band of high-frequency filter 12A). Therefore, the connection loss of the high-frequency filter 12A is able to be significantly reduced or prevented.

On the other hand, the subsequent-stage filter section 11R may include any of (1) the acoustic velocity film multilayer structure, (2) a structure in which leaky waves that propagate along a piezoelectric layer including LiTaO$_3$ are utilized as surface acoustic waves, and (3) a structure in which Love waves that propagate along a piezoelectric layer including LiNbO$_3$ are utilized as surface acoustic waves, for example.

Thus, low loss and excellent temperature characteristics are able to be provided in the low-frequency filter 11A in the case where the acoustic velocity film multilayer structure is provided for the subsequent-stage filter section 11R while the reflection coefficient of the low-frequency filter 11A is increased by the configuration of the initial-stage filter section 11F. Furthermore, in the case where Love waves generated by LiNbO$_3$ are utilized as surface acoustic waves in the subsequent-stage filter section 11R, a large bandwidth is able to be provided in the low-frequency filter 11A.

Furthermore, the elastic wave resonator of the initial-stage filter section 11F may include the acoustic velocity film multilayer structure, and the subsequent-stage filter section 11R may include (1) a structure in which leaky waves that propagate along a piezoelectric layer including LiTaO$_3$ are utilized as surface acoustic waves or (2) a structure in which Love waves that propagate along a piezoelectric layer including LiNbO$_3$ are utilized as surface acoustic waves, for example.

In the multiplexer 1A, the reflection coefficient of the initial-stage filter section 11F of the low-frequency filter 11A in the second pass band (pass band of high-frequency filter 12A) is able to be made larger than the reflection coefficient of the subsequent-stage filter section 11R of the low-frequency filter 11A in the second pass band (pass band of high-frequency filter 12A). Therefore, the connection loss of the high-frequency filter 12A is able to be significantly reduced or prevented. Furthermore, in the case where Love waves generated by LiNbO$_3$ are utilized as surface acoustic waves in the subsequent-stage filter section 11R, a large bandwidth is able to be provided in the low-frequency filter 11A.

In addition, the initial-stage filter section 11F may include a structure in which leaky waves that propagate along a piezoelectric layer including LiTaO$_3$ are utilized as surface acoustic waves, and the subsequent-stage filter section 11R may include a structure in which Love waves that propagate along a piezoelectric layer including LiNbO$_3$ are utilized as surface acoustic waves, for example.

Therefore, in the multiplexer 1A, the reflection coefficient of the initial-stage filter section 11F of the low-frequency filter 11A in the second pass band (pass band of high-frequency filter 12A) is able to be made larger than the reflection coefficient of the subsequent-stage filter section 11R of the low-frequency filter 11A in the second pass band (pass band of high-frequency filter 12A). Therefore, the connection loss of the high-frequency filter 12A is able to be significantly reduced or prevented. Furthermore, in the case where Love waves generated by LiNbO$_3$ are utilized as surface acoustic waves in the subsequent-stage filter section 11R, a large bandwidth is able to be provided in the low-frequency filter 11A.

FIG. 10A is a diagram showing generation of a spurious signal in a low-frequency region 2 of a multiplexer 1B according to a fourth modification of the first preferred embodiment. As shown in the lower portion of FIG. 10A, a Rayleigh wave spurious signal is generated at a frequency about 0.76 times the resonant frequency in the region including frequencies lower than the resonance point of the elastic wave resonator (low-frequency region 2 in FIG. 10A), particularly, in the acoustic velocity film multilayer structure or a structure in which leaky waves that propagate along a piezoelectric layer including LiTaO$_3$ are utilized as elastic waves. The impedance changes due to the generation of spurious signal, and the reflection coefficient becomes smaller in response to the change in the impedance.

FIG. 10B shows combinations of the configurations of the initial-stage filter section 12F and the subsequent-stage filter section 12R according to the fourth modification of the first preferred embodiment.

As shown in FIG. 10B, in the high-frequency filter 12B of the multiplexer 1B, the initial-stage filter section 12F may include (1) a structure in which Rayleigh waves that propagate along a piezoelectric layer including LiNbO$_3$ are utilized as surface acoustic waves, (2) a structure in which leaky waves that propagate along a piezoelectric layer including LiTaO$_3$ are utilized as surface acoustic waves, (3) a structure in which Love waves that propagate along a piezoelectric layer including LiNbO$_3$ are utilized as surface acoustic waves, (4) the elastic wave resonator of the initial-stage filter section 12F may include an SMR, or (5) the elastic wave resonator of the initial-stage filter section 12F may include an FBAR, and the elastic wave resonators of subsequent-stage filter section 12R may include the acoustic velocity film multilayer structure, for example.

In other words, as a result of the subsequent-stage filter section 12R of the high-frequency filter 12B including the acoustic velocity film multilayer structure and the initial-stage filter section 12F of the high-frequency filter 12B not including the acoustic velocity film multilayer structure, the reflection coefficient of the high-frequency filter 12B in the second pass band (pass band of low-frequency filter 11B) is able to be made large. Therefore, the connection loss of the low-frequency filter 11B is able to be significantly reduced or prevented in the case of the multiplexer 1B.

Furthermore, as shown in FIG. 10B, in the high-frequency filter 12B of the multiplexer 1B, the initial-stage filter section 12F may include (1) a structure in which Rayleigh waves that propagate along a piezoelectric layer including LiNbO$_3$ are utilized as surface acoustic waves, (2) a structure in which Love waves that propagate along a piezoelectric layer including LiNbO$_3$ are utilized as surface acoustic waves, (3) the acoustic velocity film multilayer structure, (4) the elastic wave resonator of the initial-stage filter section 12F may include an SMR, or (5) the elastic wave resonator of the initial-stage filter section 12F may include an FBAR, and the subsequent-stage filter section 12R may include a structure in which leaky waves that propagate along a piezoelectric layer including LiTaO$_3$ are utilized as surface acoustic waves, for example.

In other words, as a result of leaky waves from LiTaO$_3$ being utilized as elastic waves in the subsequent-stage filter section 12R of the high-frequency filter 12B and leaky waves from LiTaO$_3$ not being utilized as elastic waves in the initial-stage filter section 12F of the high-frequency filter 12B, the reflection coefficient of the high-frequency filter 12B in the second pass band (pass band of low-frequency filter 11B) is able to be made large. Therefore, the connection loss of the low-frequency filter 11B is able to be significantly reduced or prevented in the case of the multiplexer 1B.

Figure 11A:
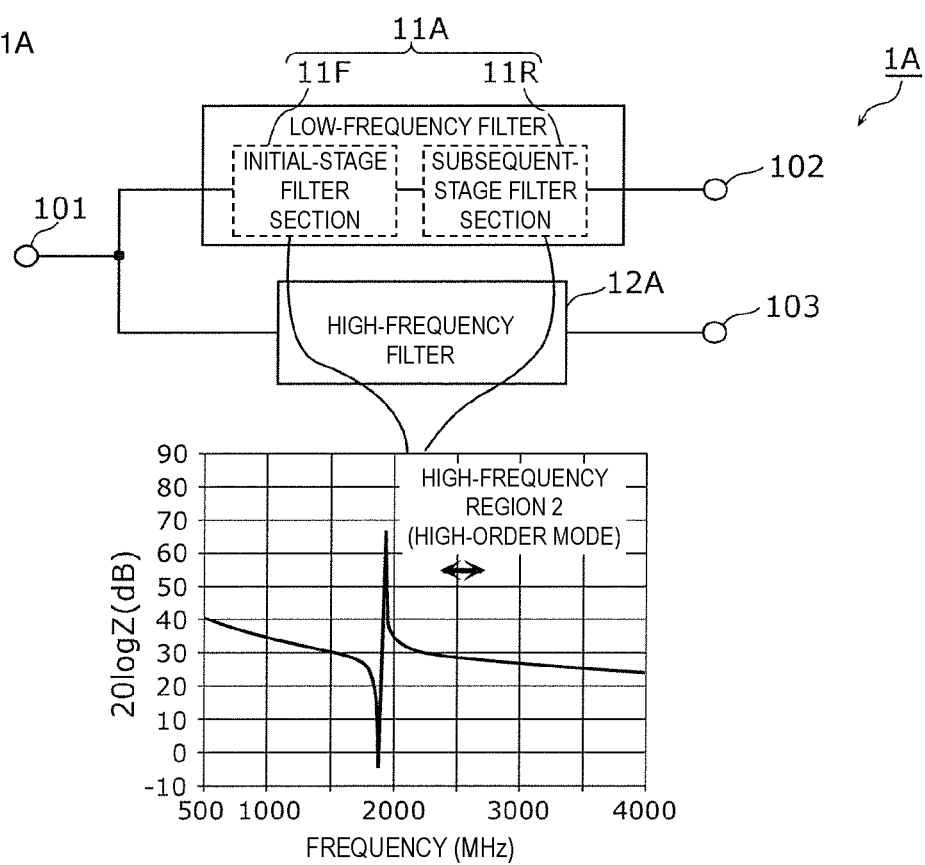
FIG. 11A is a diagram showing generation of a high-order mode in a high-frequency region of a multiplexer according to a fifth modification of the first preferred embodiment of the present invention.

FIG. 11A is a diagram showing generation of a high-order mode in a high-frequency region 2 of a multiplexer 1A according to a fifth modification of the first preferred embodiment. As shown in the lower portion of FIG. 11A, a high-order mode is generated at a frequency about 1.2 times the resonant frequency in the region including frequencies higher than the resonance point of the elastic wave resonator (high-frequency region 2 in FIG. 11A), particularly, in a structure in which Rayleigh waves that propagate along a piezoelectric layer including LiNbO$_3$ are utilized as surface acoustic waves or a structure in which Love waves that propagate along a piezoelectric layer including LiNbO$_3$ are utilized as surface acoustic waves. The impedance changes due to the generation of this high-order mode, and return loss increases in response to the change in impedance.

FIG. 11B shows combinations of the configurations of the initial-stage filter section 11F and the subsequent-stage filter section 11R according to the fifth modification of the first preferred embodiment.

As shown in FIG. 11B, in the low-frequency filter 11A of the multiplexer 1A, the initial-stage filter section 11F may include (1) the acoustic velocity film multilayer structure, (2) a structure in which leaky waves that propagate along a piezoelectric layer including LiTaO$_3$ are utilized as surface acoustic waves, (3) a structure in which Love waves that propagate along a piezoelectric layer including LiNbO$_3$ are utilized as surface acoustic waves, (4) an SMR or (5) an FBAR, and the subsequent-stage filter section 11R may include a structure in which Rayleigh waves that propagate along a piezoelectric layer including LiNbO$_3$ are utilized as surface acoustic waves, for example.

In other words, as a result of Rayleigh waves from LiNbO$_3$ being utilized as elastic waves in the subsequent-stage filter section 11R of the low-frequency filter 11A and Rayleigh waves from LiNbO$_3$ not being utilized as elastic waves in the initial-stage filter section 11F of the low-frequency filter 11A, the reflection coefficient of the low-frequency filter 11A in the second pass band (pass band of high-frequency filter 12A) is able to be made large. Therefore, the connection loss of the high-frequency filter 12A of the multiplexer 1A is able to be significantly reduced or prevented.

In addition, as shown in FIG. 11B, in the low-frequency filter 11A of the multiplexer 1A, the initial-stage filter section 11F may include (1) a structure in which Rayleigh waves that propagate along a piezoelectric layer including LiNbO$_3$ are utilized as surface acoustic waves, (2) the acoustic velocity film multilayer structure, (3) a structure in which leaky waves that propagate along a piezoelectric layer including LiTaO₃ are utilized as surface acoustic waves, (4) an SMR or (5) an FBAR, and the subsequent-stage filter section 11R may include a structure in which Love waves that propagate along a piezoelectric layer including LiNbO₃ are utilized as surface acoustic waves, for example.

In other words, as a result of Love waves from LiNbO₃ being utilized as elastic waves in the subsequent-stage filter section 11R of the low-frequency filter 11A and Love waves from LiNbO₃ not being utilized as elastic waves in the initial-stage filter section 11F of the low-frequency filter 11A, the reflection coefficient of the low-frequency filter 11A in the second pass band (pass band of high-frequency filter 12A) is able to be made large. Therefore, the connection loss of the high-frequency filter 12A of the multiplexer 1A is able to be significantly reduced or prevented.

Figure 12A:
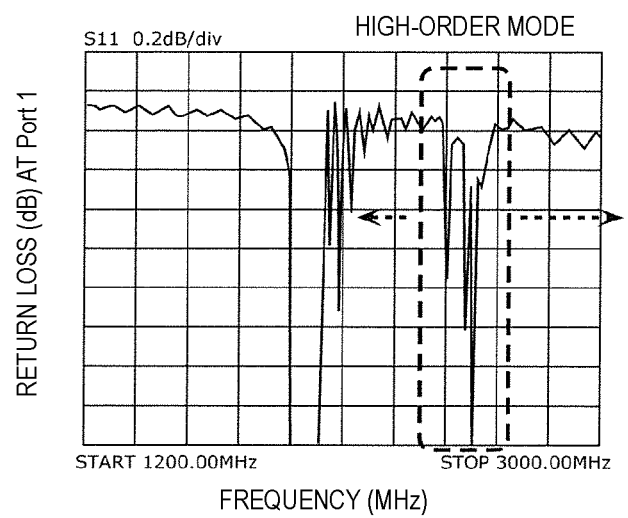
FIG. 12A is a graph that shows degradation of return loss caused by a high-order mode in a low-frequency filter according to the first preferred embodiment of the present invention.

FIG. 12A is a graph that shows degradation of return loss caused by a high-order mode in the low-frequency filter 11A of the multiplexer 1A according to the first preferred embodiment. As shown in FIG. 12A, the return loss of the low-frequency filter 11A seen from the common terminal 101 (Port 1) is increased by the high-order mode in the region including frequencies higher than the resonance point (broken line region in FIG. 12A). Here, the frequency at which the return loss is increased by the high-order mode is able to be shifted toward the high-frequency side or the low-frequency side by changing the structural parameters of the elastic wave resonator. Alternatively, an increase in the return loss (decrease in reflection coefficient) caused by the high-order mode is able to be significantly reduced or prevented by changing the structural parameters of the elastic wave resonator.

The inventors of preferred embodiments of the present invention discovered shifting the frequency at which a high-order mode, spurious signal or the like is generated in the filter B to outside the passband of the filter A by changing the structural parameters of the initial-stage filter section, which greatly affects the reflection characteristic, of the filter B, and significantly improves the structural parameters in the subsequent-stage filter section, which has a small effect on the reflection characteristic, of the filter B in order to provide filter characteristics, for example, the bandpass characteristic, the attenuation characteristic, the temperature characteristics, and the pass band width.

FIG. 12B shows the parameters that are used to make the structures of the initial-stage filter section 12F and the subsequent-stage filter section 12R of the multiplexer 1B according to a sixth modification of the first preferred embodiment different from each other.

Each elastic wave resonator of the high-frequency filter 12B preferably is a surface acoustic wave resonator that includes the substrate 80, including the piezoelectric layer 83, and the IDT electrodes 71 provided on the substrate 80. In the high-frequency filter 12B, as shown in FIG. 12B, leaky waves that propagate along a piezoelectric layer including LiTaO₃ are utilized as surface acoustic waves, and the IDT electrodes 71 of the initial-stage filter section 12F and the IDT electrodes 71 of the subsequent-stage filter section 12R have different electrode film thicknesses or duties from each other.

Rayleigh wave spurious signal is generated at a frequency that is lower than the resonant frequency of the elastic wave resonator in the case where leaky waves from LiTaO₃ are utilized as elastic waves. The frequency at which Rayleigh wave spurious signal is generated in the initial-stage filter section 12F is able to be shifted to outside the second pass band (pass band of low-frequency filter 11B) by making the electrode film thicknesses or duties of the IDT electrodes 71 different from each other in the initial-stage filter section 12F and the subsequent-stage filter section 12R. Thus, the reflection coefficient of the high-frequency filter 12B in the second pass band (pass band of low-frequency filter 11B) is able to be made large and the connection loss of the low-frequency filter 11B is able to be significantly reduced or prevented.

Furthermore, in the high-frequency filter 12B, as shown in FIG. 12B, the elastic wave resonators may each include the acoustic velocity film multilayer structure, and any of the electrode film thicknesses of the IDT electrodes 71, the duties of the IDT electrodes 71 and the film thicknesses of the low-acoustic-velocity films 82 may be made different from each other in the initial-stage filter section 12F and the subsequent-stage filter section 12R, for example.

A Rayleigh wave spurious signal is generated at a frequency that is lower than the resonant frequency of the elastic wave resonator in the case where the acoustic velocity film multilayer structure is provided. The frequency at which Rayleigh wave spurious signal is generated in the initial-stage filter section 12F is able to be shifted to outside the second pass band (pass band of low-frequency filter 11B) by making the electrode film thicknesses or duties of the IDT electrodes 71 different from each other in the initial-stage filter section 12F and the subsequent-stage filter section 12R. Thus, the reflection coefficient of the high-frequency filter 12B in the second pass band (pass band of low-frequency filter 11B) is able to be made large and the connection loss of the low-frequency filter 11B is able to be significantly reduced or prevented.

FIG. 12C shows parameters that are used to make the structures of the initial-stage filter section 11F and the subsequent-stage filter section 11R of the multiplexer 1A according to a seventh modification of the first preferred embodiment different from each other.

Each elastic wave resonator of the low-frequency filter 11A is a surface acoustic wave resonator that includes the substrate 80 including the piezoelectric layer 83, the IDT electrodes 71 provided on the substrate 80, and the protective film 84 provided on the IDT electrodes 71. In the low-frequency filter 11A, as shown in FIG. 12C, Rayleigh waves that propagate along a piezoelectric layer including LiNbO₃ or Love waves that propagate along a piezoelectric layer including LiNbO₃ are utilized as surface acoustic waves, and any of the electrode film thicknesses of the IDT electrodes 71, the duties of the IDT electrodes 71 and the film thicknesses of the protective films 84 are made different from each other in the initial-stage filter section 11F and the subsequent-stage filter section 11R.

A high-order mode is generated at a frequency that is higher than the resonant frequency of the elastic wave resonator in the case where Rayleigh waves from LiNbO₃ or Love waves from LiNbO₃ are utilized as surface acoustic waves. The frequency at which a high-order mode is generated in the initial-stage filter section 11F is able to shifted to outside the second pass band (pass band of high-frequency filter 12A) by making the electrode film thicknesses of the IDT electrodes 71, the duties of the IDT electrodes 71 or the film thicknesses of the protective films 84 different from each other in the initial-stage filter section 11F and the subsequent-stage filter section 11R. Thus, the reflection coefficient of the low-frequency filter 11A in the second pass band (pass band of high-frequency filter 12A) is able to be made large, and the connection loss of the high-frequency filter 12A is able to be significantly reduced or prevented.

Furthermore, in the low-frequency filter 11A, as shown in FIG. 12C, each elastic wave resonator may include the acoustic velocity film multilayer structure, the high-acoustic-velocity support substrate 81 may be made of silicon crystal, and any of the film thicknesses of the piezoelectric layers 83, the film thicknesses of the low-acoustic-velocity films 82 and the silicon crystal orientations of the high-acoustic-velocity support substrates 81 may be different from each other in the initial-stage filter section 11F and the subsequent-stage filter section 11R, for example.

A high-order mode is generated at a frequency that is higher than the resonant frequency of the elastic wave resonator in the case where the acoustic velocity film multilayer structure is provided. The frequency at which a high-order mode is generated in the initial-stage filter section 11F is able to shifted to outside the second pass band (pass band of high-frequency filter 12A) by making the film thicknesses of the piezoelectric layers 83, the film thicknesses of the low-acoustic-velocity films 82 or the silicon crystal orientations of the high-acoustic-velocity support substrates 81 different from each other in the initial-stage filter section 11F and the subsequent-stage filter section 11R. Thus, the reflection coefficient of the low-frequency filter 11A in the second pass band (pass band of high-frequency filter 12A) is able to be made large, and the connection loss of the high-frequency filter 12A is able to be significantly reduced or prevented.

FIG. 13 shows parameters that are used to make the structures of the initial-stage filter section 11F and the subsequent-stage filter section 11R of the multiplexer 1A according to an eighth modification of the first preferred embodiment different from each other.

Each elastic wave resonator of the low-frequency filter 11A is a surface acoustic wave resonator that includes the substrate 80 including the piezoelectric layer 83, and the IDT electrodes 71 provided on the substrate 80. In the low-frequency filter 11A, leaky waves that propagate along a piezoelectric layer including $LiTaO_3$ or Love waves that propagate along a piezoelectric layer including $LiNbO_3$ are utilized as surface acoustic waves, and the electrode film thicknesses of the IDT electrodes 71 are made different from each other in the initial-stage filter section 11F and the subsequent-stage filter section 11R.

Bulk waves (unwanted waves) are generated at a frequency that is higher than the resonant frequency of the elastic wave resonator in the case where leaky waves from $LiTaO_3$ or Love waves from $LiNbO_3$ are utilized as surface acoustic waves. The frequency at which bulk waves are generated in the initial-stage filter section 11F is able to be shifted to outside the second pass band (pass band of high-frequency filter 12A) by making the electrode film thicknesses of the IDT electrodes 71 different from each other in the initial-stage filter section 11F and the subsequent-stage filter section 11R. Thus, the reflection coefficient of the low-frequency filter 11A in the second pass band (pass band of high-frequency filter 12A) is able to be made large, and the connection loss of the high-frequency filter 12A is able to be significantly reduced or prevented.

Figure 14:
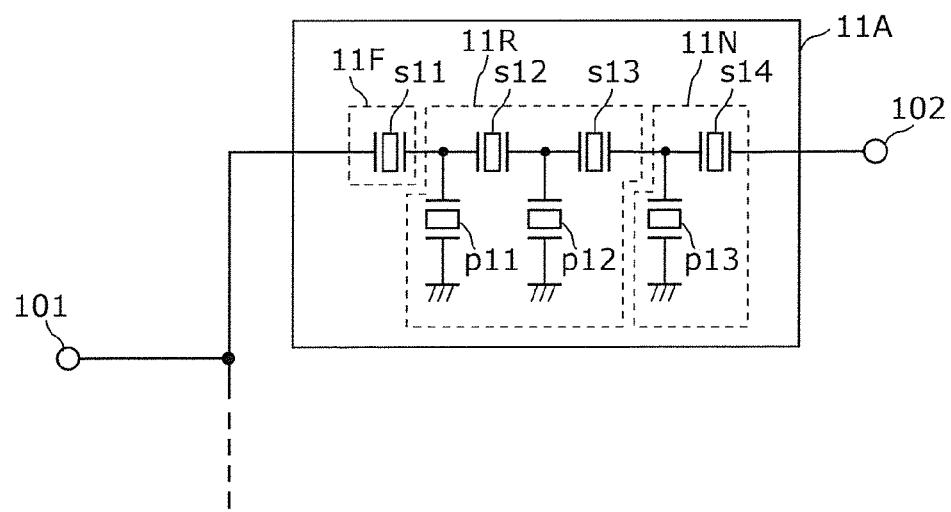
FIG. 14 is a diagram of the circuit configuration of a low-frequency filter according to a ninth modification of the first preferred embodiment of the present invention.

FIG. 14 is a diagram of the circuit configuration of a low-frequency filter 11A according to a ninth modification of the first preferred embodiment. The circuit configuration of the low-frequency filter shown in FIG. 14 is the same as or similar to the circuit configuration of the low-frequency filter according to the first preferred embodiment, except that, in addition to the initial-stage filter section 11F and the subsequent-stage filter section 11R, a final-stage filter section 11N is also defined.

Here, the initial-stage filter section 11F includes the series arm resonator s11 that is closest to the common terminal 101 among the series arm resonators s11, s12, s13, and s14 and the parallel arm resonators p11, p12, and p13, the subsequent-stage filter section 11R includes the series arm resonators s12 and s13 and the parallel arm resonators p11 and p12, and the final-stage filter section 11N includes the series arm resonator s14 and the parallel arm resonator p13. In this case, a reflection coefficient of the initial-stage filter section 11F in a pass band 12H (second pass band) when the initial-stage filter section 11F is viewed from the common terminal 101 side as a single component is larger than a reflection coefficient of the subsequent-stage filter section 11R in the pass band 12H (second pass band) when the subsequent-stage filter section 11R is viewed from the common terminal 101 side as a single component. In contrast, the return loss of the final-stage filter section 11N has no effect or substantially no effect on the return loss of the low-frequency filter 11A when the low-frequency filter 11A is viewed from the common terminal 101 side as a single component, and therefore may be arbitrarily set, for example.

In addition, the low-frequency filter 11A of the multiplexer 1A and the high-frequency filter 12B of the multiplexer 1B may each include a ladder filter structure, for example. As a result, connection losses of the high-frequency filter 12A and the low-frequency filter 11B are able to be significantly reduced or prevented while providing low loss characteristics for the low-frequency filter 11A and the high-frequency filter 12B. In this case, it is sufficient for the initial-stage filter section to include at least either of a series arm resonator and a parallel arm resonator.

Figure 15A:
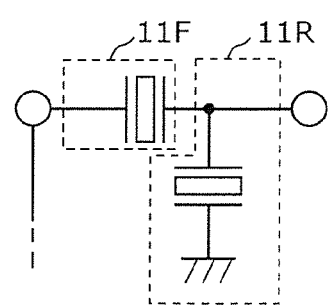
FIG. 15A is a diagram of the circuit configuration of a low-frequency filter according to a tenth modification of the first preferred embodiment of the present invention.
Figure 15B:
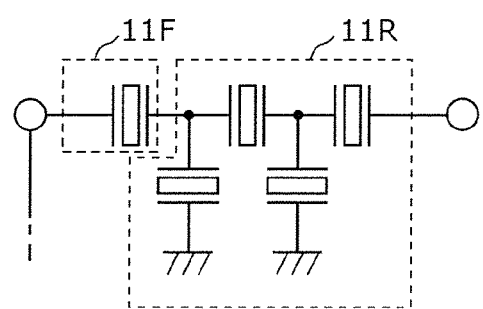
FIG. 15B is a diagram of the circuit configuration of a low-frequency filter according to an eleventh modification 11 of the first preferred embodiment of the present invention.

FIG. 15A is a diagram of the circuit configuration of a low-frequency filter 11A according to a tenth modification of the first preferred embodiment. In addition, FIG. 15B is a diagram of the circuit configuration of a low-frequency filter 11A according to an eleventh modification of the first preferred embodiment. As shown in FIG. 15A, it is sufficient for the low-frequency filter 11A to include at least one series arm resonator and at least one parallel arm resonator. In the configuration shown in FIG. 15A, the initial-stage filter section 11F includes a series arm resonator, and the subsequent-stage filter section 11R includes a parallel arm resonator. Furthermore, in the configuration shown in FIG. 15B, the initial-stage filter section 11F includes one series arm resonator, and the subsequent-stage filter section 11R includes two series arm resonators and two parallel arm resonators.

Figure 15C:
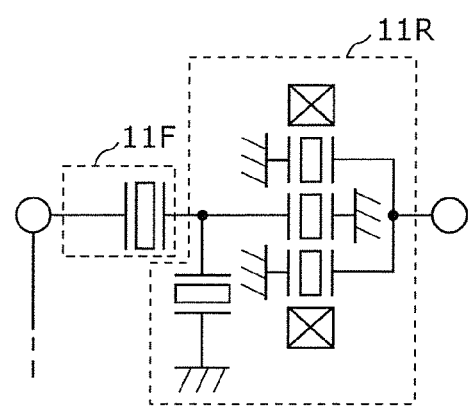
FIG. 15C is a diagram of the circuit configuration of a low-frequency filter according to a twelfth modification of the first preferred embodiment of the present invention.
Figure 15D:
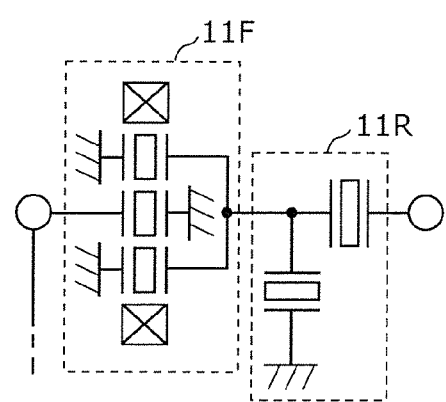
FIG. 15D is a diagram of the circuit configuration of a low-frequency filter according to a thirteenth modification of the first preferred embodiment of the present invention.
Figure 15E:
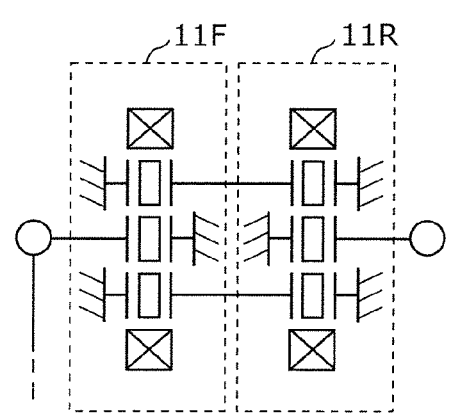
FIG. 15E is a diagram of the circuit configuration of a low-frequency filter according to a fourteenth modification of the first preferred embodiment of the present invention.

FIGS. 15C, 15D, and 15E are diagrams of the circuit configurations of low-frequency filters 11A according to a twelfth modification, a thirteenth modification, and a fourteenth modification of the first preferred embodiment. As shown in FIGS. 15C, 15D, and 15E, the low-frequency filter 11A may include a longitudinally coupled filter structure. Therefore, the low-frequency filter 11A and the high-frequency filter 12B are able to be adapted to a filter characteristic which strengthens attenuation, for example.

Figure 16A:
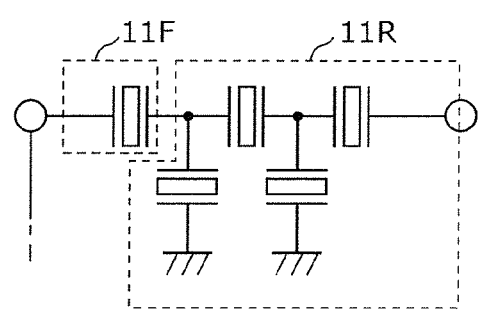
FIG. 16A is a diagram of the circuit configuration of a low-frequency filter according to a fifteenth modification of the first preferred embodiment of the present invention.
Figure 16B:
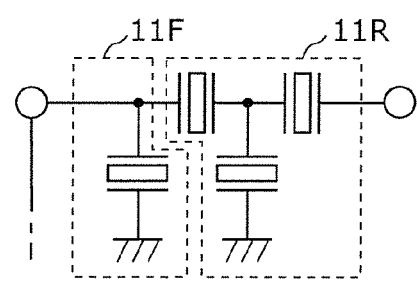
FIG. 16B is a diagram of the circuit configuration of a low-frequency filter according to a sixteenth modification of the first preferred embodiment of the present invention.

FIG. 16A is a diagram of the circuit configuration of a low-frequency filter 11A according to a fifteenth modification of the first preferred embodiment, and FIG. 16B is a diagram of the circuit configuration of a low-frequency filter 11A according to a sixteenth modification of the first preferred embodiment. As shown in FIGS. 16A and 16B, the elastic wave resonator that is closest to the common terminal 101 may be a series arm resonator or may be a parallel arm resonator, for example.

Figure 17:
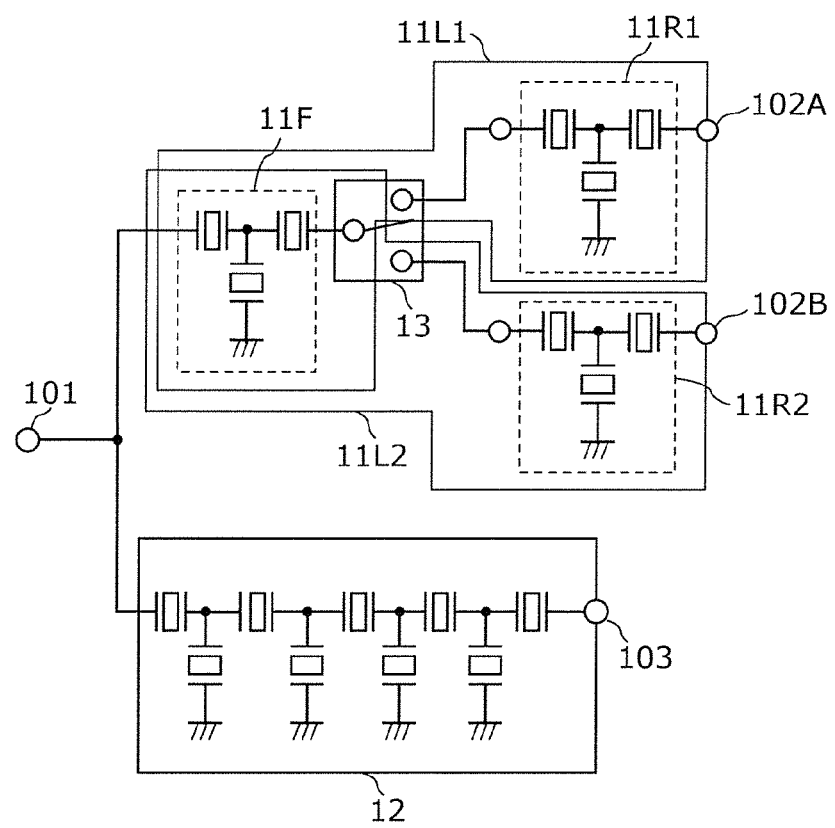
FIG. 17 is a diagram of the circuit configuration of a multiplexer according to a seventeenth modification of the first preferred embodiment of the present invention.

FIG. 17 is a diagram of the circuit configuration of a multiplexer according to a seventeenth modification of the first preferred embodiment. The multiplexer shown in FIG. 17 differs from the multiplexer 1A according to the first preferred embodiment in that two low-frequency filters 11L1 and 11L2 are provided instead of the low-frequency filter 11A. Hereafter, the multiplexer according to the seventeenth modification will be described while focusing on the features of the multiplexer of this modification that differ from the multiplexer 1A according to the first preferred embodiment.

The multiplexer according to this modification includes a common terminal 101, input/output terminal 102A (first input/output terminal), input/output terminal 102B (third input/output terminal), input/output terminal 103 (second input/output terminal), the low-frequency filter 11L1 located between the common terminal 101 and the input/output terminal 102A, the low-frequency filter 11L2 (third filter) located between the common terminal 101 and the input/output terminal 102B and including a third pass band that is at a different frequency from the pass band of the low-frequency filter 11L1, and a high/low frequency filter 12 located between the common terminal 101 and the input/output terminal 103.

The low-frequency filter 11L2 includes an initial-stage filter section 11F, and a second subsequent-stage filter section 11R2 that is located on the input/output terminal 102B side of at least two elastic wave resonators, and includes elastic wave resonators other than those of the initial-stage filter section 11F.

The low-frequency filter 11L1 and the low-frequency filter 11L2 further include a switch 13 that is located between the initial-stage filter section 11F and the subsequent-stage filter section 11R1 and the second subsequent-stage filter section 11R2, the switch 13 switching a connection between the initial-stage filter section 11F and the subsequent-stage filter section 11R1 and a connection between the initial-stage filter section 11F and the second subsequent-stage filter section 11R2. Here, the reflection coefficient of the initial-stage filter section 11F in the pass band of the high/low frequency filter 12 when the initial-stage filter section 11F is viewed as a single component from the common terminal 101 side is larger than the reflection coefficient of the second subsequent-stage filter section 11R2 in the pass band of the high/low frequency filter 12 when the second subsequent-stage filter section 11R2 is viewed as a single component from the common terminal 101 side.

Thus, for example, even in the case where the frequency bands of the low-frequency filter 11L1 and the low-frequency filter 11L2 overlap each other, connection loss of the high/low frequency filter 12 is able to be significantly reduced or prevented without degrading the insertion losses of the low-frequency filters 11L1 and 11L2 by switching the switch 13. In addition, the low-frequency filters 11L1 and 11L2 share the initial-stage filter section 11F, and therefore the overall size of the multiplexer is able to be significantly reduced.

Second Preferred Embodiment

The multiplexers according to the first preferred embodiment and the modifications thereof described above are able to be applied to a high-frequency front-end circuit, and to a communication device that includes the high-frequency front-end circuit. Accordingly, in a second preferred embodiment of the present invention, such a high-frequency front-end circuit and such a communication device will be described.

Figure 18:
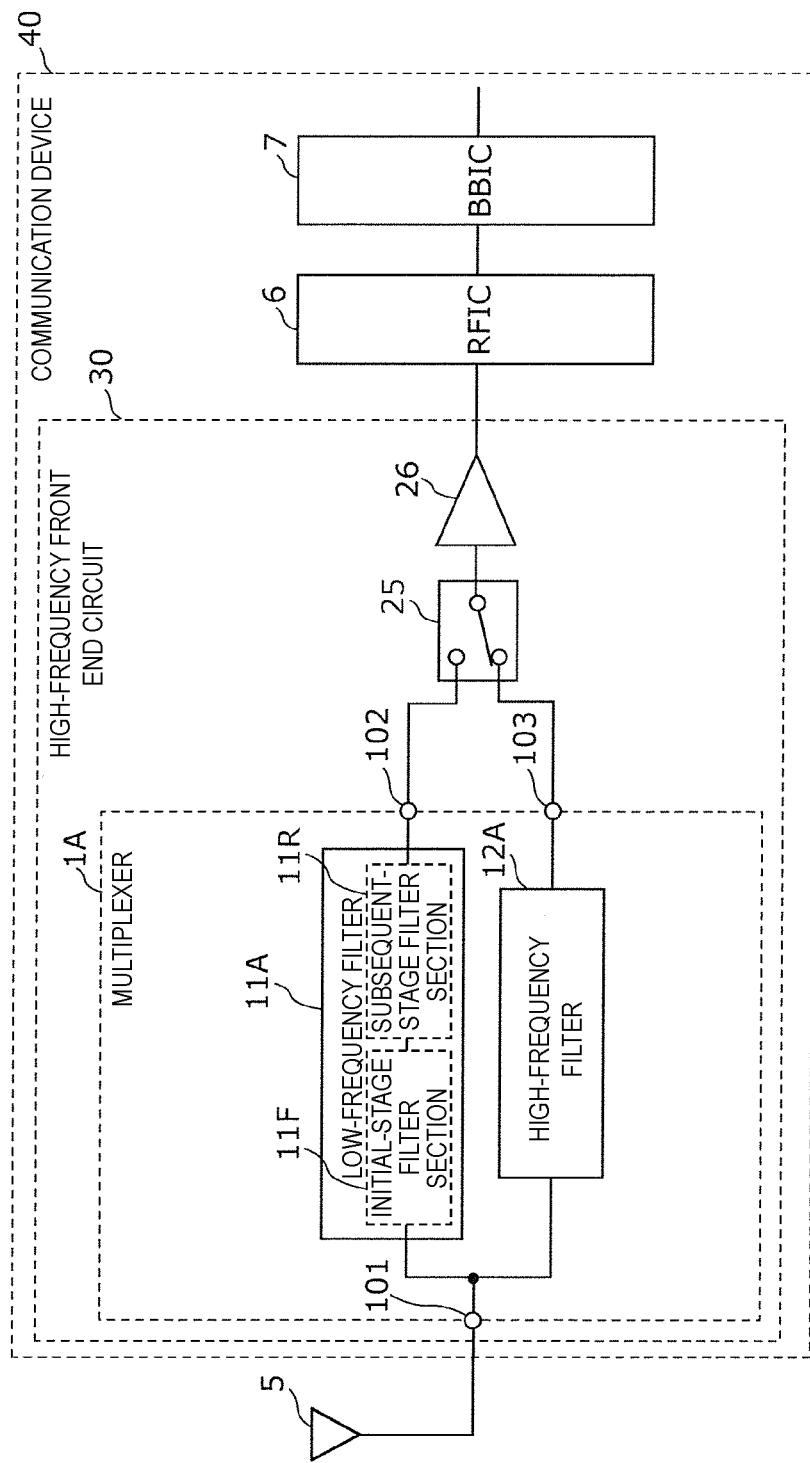
FIG. 18 is a diagram of the circuit configurations of a high-frequency front-end circuit and a communication device according to a second preferred embodiment of the present invention.

FIG. 18 is a diagram of the circuit configurations of a high-frequency front-end circuit 30 and a communication device 40 according to the second preferred embodiment. In FIG. 18, an antenna element 5 that is connected to the communication device 40 is also shown. The communication device 40 preferably includes the high-frequency front-end circuit 30, an RF signal processing circuit (RFIC) 6 and a baseband signal processing circuit (BBIC) 7.

The high-frequency front-end circuit 30 includes a multiplexer 1A, a switch 25 and a low-noise amplifier circuit 26.

The multiplexer 1A of the second preferred embodiment preferably is the multiplexer 1A according to the first preferred embodiment, for example.

The switch 25 is a switch circuit that includes two selection terminals that are individually connected to the input/output terminals 102 and 103 of the multiplexer 1A, and a common terminal that is connected to the low-noise amplifier circuit 26. The switch 25 connects the common terminal and a signal path corresponding to a prescribed band in accordance with a control signal from a control component (not shown), and includes a single pole double throw switch (SPDT), for example. The number of selection terminals connected to the common terminal is not limited to one and may be a plurality, for example. In other words, the high-frequency front-end circuit 30 may support carrier aggregation.

The low-noise amplifier circuit 26 is a reception amplification circuit that amplifies a high-frequency signal (in this case, high-frequency reception signal) supplied thereto via the antenna element 5, the multiplexer 1A and the switch 25, and that outputs the amplified high-frequency signal to the RF signal processing circuit 6.

The RF signal processing circuit 6 subjects the high-frequency reception signal, which is input thereto from the antenna element 5 via a reception signal path, to signal processing with down-conversion or the like, and outputs a reception signal generated through the signal processing to the baseband signal processing circuit 7. The RF signal processing circuit 6 is an RFIC, for example.

A signal that has undergone processing by the baseband signal processing circuit 7 is able to be used as an image signal in image display or as an audio signal in a telephone conversation, for example.

The high-frequency front-end circuit 30 may include other circuit elements between the above-described elements.

According to the high-frequency front-end circuit 30 and communication device 40 described above, transmission loss of a high-frequency signal is able to be significantly reduced or prevented, and significant reductions in size and cost are able to be provided as a result of the high-frequency front-end circuit 30 and the communication device 40 including a multiplexer according to the first preferred embodiment or a modification thereof.

The high-frequency front-end circuit 30 may include a triplexer or a quadplexer that is able to handle both transmission and reception instead of the multiplexer 1A according to the first preferred embodiment, for example.

Furthermore, the communication device 40 does not necessarily need to include the baseband signal processing circuit (BBIC) 7 depending on the high-frequency signal processing method used, for example.

Other Modifications

Multiplexers, high-frequency front-end circuits, and communication devices according to preferred embodiments of the present invention have been described above with respect to the preferred embodiments and modifications of the preferred embodiments of the present invention, but other preferred embodiments provided, for example, by combining arbitrary elements, features, structural characteristics, etc. of the above-described preferred embodiments and modifications, modifications obtained by a person skilled in the art modifying the above-described preferred embodiments and modifications in various ways without departing from the gist of the present invention, and various devices including the high-frequency front-end circuit and the communication device according to a preferred embodiment of the present invention incorporated therein are also included in the scope of the present invention.

For example, in the above description, a two-branch demultiplexing/multiplexing circuit in which two reception signal paths are connected to each other at a common terminal is described as an example of a multiplexer, but the present invention is able to also be applied to a circuit including both a transmission path and a reception path and to demultiplexing/multiplexing circuit in which three or more signal paths are connected to each other at a common terminal, for example.

In addition, in each filter of the multiplexer, an inductor or capacitor may be connected between terminals such as the input/output terminals, ground terminals, and the like, and circuit elements other than inductors and capacitors such as resistance elements may be added, for example.

Preferred embodiments of the present invention and modifications thereof are able to be included in wide variety of communication devices, for example, cellular phones, as multiplexers, high-frequency front-end circuits, and communication devices with low loss, small size, and low cost that are able to be applied to frequency standards that handle multiple bands and multiple modes.

While preferred embodiments of the present invention and modifications thereof have been described above, it is to be understood that variations and modifications will be apparent to those skilled in the art without departing from the scope and spirit of the present invention. The scope of the present invention, therefore, is to be determined solely by the following claims.

What is claimed is:

1. A multiplexer comprising:
   a common terminal;
   a first input/output terminal;
   a second input/output terminal;
   a plurality of filters that are connected to each other at the common terminal;
   a first filter that includes at least two elastic wave resonators that are located between the common terminal and the first input/output terminal, the first filter including a first pass band; and
   a second filter that is connected between the common terminal and the second input/output terminal, the second filter including a second pass band that is at a different frequency from the first pass band; wherein
   the first filter includes:
      an initial-stage filter section that includes at least one first elastic wave resonator located on the common terminal side among the at least two elastic wave resonators, and
      a subsequent-stage filter section that includes a second elastic wave resonator that is different from the at least one first elastic wave resonator; and
   a reflection coefficient of the initial-stage filter section in the second pass band when the initial-stage filter section is viewed from the common terminal side as a single component is larger than a reflection coefficient of the subsequent-stage filter section in the second pass band when the subsequent-stage filter section is viewed from the common terminal side as a single component.

2. The multiplexer according to claim 1, wherein the at least one first elastic wave resonator of the initial-stage filter section is one elastic wave resonator that is closest to the common terminal among the at least two elastic wave resonators.

3. The multiplexer according to claim 1, wherein
   the first filter includes a ladder filter structure; and
   the initial-stage filter section includes at least either of a series arm resonator and a parallel arm resonator as the at least one first elastic wave resonator.

4. The multiplexer according to claim 1, wherein the first filter has a longitudinally coupled filter structure.

5. The multiplexer according to claim 1, wherein
   the first pass band is located closer to a high-frequency side than the second pass band;
   the at least one first elastic wave resonator of the initial-stage filter section is a surface acoustic wave resonator that includes a substrate including a piezoelectric layer, and an IDT electrode that is provided on the substrate; and
   in the initial-stage filter section, any one of (1) Rayleigh waves that propagate along the piezoelectric layer, which includes $LiNbO_3$, (2) leaky waves that propagate along the piezoelectric layer, which includes $LiTaO_3$, and (3) Love waves that propagate along the piezoelectric layer, which includes $LiNbO_3$, are utilized as surface acoustic waves.

6. The multiplexer according to claim 5, wherein, in the subsequent-stage filter section, the second elastic wave resonator includes a solidly mounted resonator or a film bulk acoustic resonator.

7. The multiplexer according to claim 1, wherein
   the first pass band is located closer to a high-frequency side than the second pass band;
   the at least one first elastic wave resonator of the initial-stage filter section is a surface acoustic wave resonator that includes a substrate including a piezoelectric layer, and an IDT electrode that is provided on the substrate;
   in the initial-stage filter section, the at least one first elastic wave resonator has an acoustic velocity film multilayer structure that includes the piezoelectric layer that includes the IDT electrode provided on one main surface thereof, a high-acoustic-velocity support substrate in which an acoustic velocity of propagating bulk waves is higher than an acoustic velocity of elastic waves propagating along the piezoelectric layer, and a low-acoustic-velocity film that is located between the high-acoustic-velocity support substrate and the piezoelectric layer and in which an acoustic velocity of propagating bulk waves is lower than an acoustic velocity of elastic waves propagating along the piezoelectric layer; and
   in the subsequent-stage filter section, the second elastic wave resonator includes a solidly mounted resonator or a film bulk acoustic resonator.

8. The multiplexer according to claim 1, wherein
   the first pass band is located closer to a low-frequency side than the second pass band; and
   in the initial-stage filter section, (1) Rayleigh waves that propagate along a piezoelectric layer including $LiNbO_3$ are utilized as surface acoustic waves, (2) the at least one first elastic wave resonator includes a solidly mounted resonator, or (3) the at least one first elastic wave resonator includes a film bulk acoustic resonator.

9. The multiplexer according to claim 8, wherein, in the subsequent-stage filter section, (1) the second elastic wave resonator includes an acoustic velocity film multilayer structure that includes a piezoelectric layer that includes an IDT electrode provided on one main surface thereof, a high-acoustic-velocity support substrate in which an acoustic velocity of propagating bulk waves is higher than an acoustic velocity of elastic waves propagating along the piezoelectric layer, and a low-acoustic-velocity film that is located between the high-acoustic-velocity support substrate and the piezoelectric layer and in which an acoustic velocity of propagating bulk waves is lower than an acoustic velocity of elastic waves propagating along the piezoelectric layer, (2) leaky waves that propagate along a piezoelectric layer including $LiTaO_3$ are utilized as surface acoustic waves, or (3) Love waves that propagate along a piezoelectric layer including $LiNbO_3$ are utilized as surface acoustic waves.

10. The multiplexer according to claim 1, wherein
the first pass band is located closer to a low-frequency side than the second pass band;
the at least one first elastic wave resonator and the second elastic wave resonator that respectively define the initial-stage filter section and the subsequent-stage filter section are surface acoustic wave resonators that each include a substrate including a piezoelectric layer, and an IDT electrode that is provided on the substrate;
in the initial-stage filter section, the at least one first elastic wave resonator includes an acoustic velocity film multilayer structure that includes the piezoelectric layer that includes the IDT electrode provided on one main surface thereof, a high-acoustic-velocity support substrate in which an acoustic velocity of propagating bulk waves is higher than an acoustic velocity of elastic waves propagating along the piezoelectric layer, and a low-acoustic-velocity film that is located between the high-acoustic-velocity support substrate and the piezoelectric layer and in which an acoustic velocity of propagating bulk waves is lower than an acoustic velocity of elastic waves propagating along the piezoelectric layer; and
in the subsequent-stage filter section, (1) leaky waves that propagate along the piezoelectric layer, which includes $LiTaO_3$, or (2) Love waves that propagate along the piezoelectric layer, which includes $LiNbO_3$, are utilized as surface acoustic waves.

11. The multiplexer according to claim 1, wherein
the first pass band is located closer to a low-frequency side than the second pass band;
the at least one first elastic wave resonator and the second elastic wave resonator that respectively define the initial-stage filter section and the subsequent-stage filter section are surface acoustic wave resonators that each include a substrate including a piezoelectric layer, and an IDT electrode that is provided on the substrate;
in the initial-stage filter section, leaky waves that propagate along the piezoelectric layer, which includes $LiTaO_3$, are utilized as surface acoustic waves; and
in the subsequent-stage filter section, Love waves that propagate along a piezoelectric layer, which includes $LiNbO_3$, are utilized as surface acoustic waves.

12. The multiplexer according to claim 1, wherein
the first pass band is located closer to a high-frequency side than the second pass band;
in the initial-stage filter section, (1) Rayleigh waves that propagate along a piezoelectric layer including $LiNbO_3$ are utilized as surface acoustic waves, (2) leaky waves that propagate along a piezoelectric layer including $LiTaO_3$ are utilized as surface acoustic waves, (3) Love waves that propagate along a piezoelectric layer including $LiNbO_3$ are utilized as surface acoustic waves, (4) the at least one first elastic wave resonator includes a solidly mounted resonator, or (5) the at least one first elastic wave resonator includes a film bulk acoustic resonator; and
in the subsequent-stage filter section, the second elastic wave resonator includes an acoustic velocity film multilayer structure that includes a piezoelectric layer that an IDT electrode provided on one main surface thereof, a high-acoustic-velocity support substrate in which an acoustic velocity of propagating bulk waves is higher than an acoustic velocity of elastic waves propagating along the piezoelectric layer, and a low-acoustic-velocity film that is located between the high-acoustic-velocity support substrate and the piezoelectric layer and in which an acoustic velocity of propagating bulk waves is lower than an acoustic velocity of elastic waves propagating along the piezoelectric layer.

13. The multiplexer according to claim 1, wherein
the first pass band is located closer to a high-frequency side than the second pass band;
in the initial-stage filter section, (1) Rayleigh waves that propagate along a piezoelectric layer including $LiNbO_3$ are utilized as surface acoustic waves, (2) Love waves that propagate along a piezoelectric layer including $LiNbO_3$ are utilized as surface acoustic waves, (3) the at least one first elastic wave resonator includes an acoustic velocity film multilayer structure that includes a piezoelectric layer that includes an IDT electrode provided on one main surface thereof, a high-acoustic-velocity support substrate in which an acoustic velocity of propagating bulk waves is higher than an acoustic velocity of elastic waves propagating along the piezoelectric layer, and a low-acoustic-velocity film that is located between the high-acoustic-velocity support substrate and the piezoelectric layer and in which an acoustic velocity of propagating bulk waves is lower than an acoustic velocity of elastic waves propagating along the piezoelectric layer, (4) the at least one first elastic wave resonator includes a solidly mounted resonator, or (5) the at least one first elastic wave resonator includes a film bulk acoustic resonator; and
in the subsequent-stage filter section, leaky waves that propagate along a piezoelectric layer including $LiTaO_3$ are utilized as surface acoustic waves.

14. The multiplexer according to claim 1, wherein
the first pass band is located closer to a low-frequency side than the second pass band;
in the initial-stage filter section, (1) the at least one first elastic wave resonator includes an acoustic velocity film multilayer structure that includes a piezoelectric layer that includes an IDT electrode provided on one main surface thereof, a high-acoustic-velocity support substrate in which an acoustic velocity of propagating bulk waves is higher than an acoustic velocity of elastic waves propagating along the piezoelectric layer, and a low-acoustic-velocity film that is located between the high-acoustic-velocity support substrate and the piezoelectric layer and in which an acoustic velocity of propagating bulk waves is lower than an acoustic velocity of elastic waves propagating along the piezoelectric layer, (2) leaky waves that propagate along a piezoelectric layer including $LiTaO_3$ are utilized as surface acoustic waves, (3) Love waves that propagate along a piezoelectric layer including $LiNbO_3$ are utilized as surface acoustic waves, (4) the at least one first elastic wave resonator includes a solidly mounted resonator, or (5) at least one first the elastic wave resonator includes a film bulk acoustic resonator; and in the subsequent-stage filter section, Rayleigh waves that propagate along a piezoelectric layer including LiNbO$_3$ are utilized as surface acoustic waves.

15. The multiplexer according to claim 1, wherein the first pass band is located closer to a low-frequency side than the second pass band;

in the initial-stage filter section, (1) Rayleigh waves that propagate along a piezoelectric layer including LiNbO$_3$ are utilized as surface acoustic waves, (2) the at least one first elastic wave resonator has an acoustic velocity film multilayer structure that includes a piezoelectric layer that includes an IDT electrode provided on one main surface thereof, a high-acoustic-velocity support substrate in which an acoustic velocity of propagating bulk waves is higher than an acoustic velocity of elastic waves propagating along the piezoelectric layer, and a low-acoustic-velocity film that is located between the high-acoustic-velocity support substrate and the piezoelectric layer and in which an acoustic velocity of propagating bulk waves is lower than an acoustic velocity of elastic waves propagating along the piezoelectric layer, (3) leaky waves that propagate along a piezoelectric layer including LiTaO$_3$ are utilized as surface acoustic waves, (4) the at least one first elastic wave resonator includes a solidly mounted resonator, or (5) the at least one first elastic wave resonator includes a film bulk acoustic resonator; and in the subsequent-stage filter section, Love waves that propagate along a piezoelectric layer including LiNbO$_3$ are utilized as surface acoustic waves.

16. The multiplexer according to claim 1, wherein the at least two elastic wave resonators of the first filter are surface acoustic wave resonators that each include a substrate including a piezoelectric layer, and an IDT electrode that is provided on the substrate;

in the first filter, leaky waves that propagate along the piezoelectric layer, which includes LiTaO$_3$, are utilized as surface acoustic waves; and the IDT electrode of the initial-stage filter section and the IDT electrode of the subsequent-stage filter section have different film thicknesses or duties from each other.

17. The multiplexer according to claim 1, wherein the at least two elastic wave resonators of the first filter are surface acoustic wave resonators that each include a substrate including a piezoelectric layer, and an IDT electrode that is provided on the substrate; and in the first filter, the elastic wave resonators each include an acoustic velocity film multilayer structure that includes the piezoelectric layer that includes the IDT electrode provided on one main surface thereof, a high-acoustic-velocity support substrate in which an acoustic velocity of propagating bulk waves is higher than an acoustic velocity of elastic waves propagating along the piezoelectric layer, and a low-acoustic-velocity film that is located between the high-acoustic-velocity support substrate and the piezoelectric layer and in which an acoustic velocity of propagating bulk waves is lower than an acoustic velocity of elastic waves propagating along the piezoelectric layer; and any of film thicknesses of the IDT electrodes, duties of the IDT electrodes, and film thicknesses of the low-acoustic-velocity films are different from each other in the initial-stage filter section and the subsequent-stage filter section.

18. The multiplexer according to claim 1, wherein the at least two elastic wave resonators of the first filter are surface acoustic wave resonators that each include a substrate including a piezoelectric layer, an IDT electrode that is provided on the substrate, and a protective film that is formed on the IDT electrode;

in the first filter, (1) Rayleigh waves that propagate along the piezoelectric layer, which includes LiNbO$_3$, or (2) Love waves that propagate along the piezoelectric layer, which includes LiNbO$_3$, are utilized as surface acoustic waves; and any of film thicknesses of the IDT electrodes, duties of the IDT electrodes, and film thicknesses of the protective films are different from each other in the initial-stage filter section and the subsequent-stage filter section.

19. The multiplexer according to claim 1, wherein the at least two elastic wave resonators of the first filter are surface acoustic wave resonators that each include a substrate including a piezoelectric layer, and an IDT electrode that is provided on the substrate;

in the first filter, the elastic wave resonators each include an acoustic velocity film multilayer structure that includes the piezoelectric layer that includes the IDT electrode provided on one main surface thereof, a high-acoustic-velocity support substrate in which an acoustic velocity of propagating bulk waves is higher than an acoustic velocity of elastic waves propagating along the piezoelectric layer, and a low-acoustic-velocity film that is located between the high-acoustic-velocity support substrate and the piezoelectric layer and in which an acoustic velocity of propagating bulk waves is lower than an acoustic velocity of elastic waves propagating along the piezoelectric layer;

the high-acoustic-velocity support substrate includes silicon crystal; and any of film thicknesses of the piezoelectric layers, film thicknesses of the low-acoustic-velocity films, and silicon crystal orientations of the high-acoustic-velocity support substrates are different from each other in the initial-stage filter section and the subsequent-stage filter section.

20. The multiplexer according to claim 1, wherein the at least two elastic wave resonators of the first filter are surface acoustic wave resonators that each include a substrate including a piezoelectric layer, and an IDT electrode that is provided on the substrate;

in the first filter, (1) leaky waves that propagate along the piezoelectric layer, which includes LiTaO$_3$, or (2) Love waves that propagate along the piezoelectric layer, which includes LiNbO$_3$, are utilized as surface acoustic waves; and film thicknesses of the IDT electrodes are different from each other in the initial-stage filter section and the subsequent-stage filter section.

21. The multiplexer according to claim 1, further comprising:

a third input/output terminal; and a third filter that includes at least two elastic wave resonators that are located between the common terminal and the third input/output terminal, the third filter including a third pass band that is at a different frequency from the second pass band; wherein the third filter includes:

the initial-stage filter section; and a second subsequent-stage filter section that includes a third elastic wave resonator, which is different from the at least one first elastic wave resonator of the initial-stage filter section, that is located on the third input/output terminal side among the at least two elastic wave resonators;

the first filter and the third filter further include:
  a switch that is located between the initial-stage filter section, and the subsequent-stage filter section and the second subsequent-stage filter section, and that switches a connection between the initial-stage filter section and the subsequent-stage filter section, and a connection between the initial-stage filter section and the second subsequent-stage filter section; and
  a reflection coefficient of the initial-stage filter section in the second pass band when the initial-stage filter section is viewed from the common terminal side as a single component is larger than a reflection coefficient of the second subsequent-stage filter section in the second pass band when the second subsequent-stage filter section is viewed from the common terminal side as a single component.

22. A high-frequency front-end circuit comprising:
the multiplexer according to claim 1; and
an amplification circuit that is connected to the multiplexer.

23. A communication device comprising:
an RF signal processing circuit that processes a high-frequency signal transmitted or received by an antenna element; and
the high-frequency front-end circuit according to claim 22 that transmits the high-frequency signal between the antenna element and the RF signal processing circuit.

\* \* \* \* \*